(12) United States Patent
Staszewski et al.

(10) Patent No.: US 8,542,616 B2
(45) Date of Patent: Sep. 24, 2013

(54) SIMULTANEOUS MULTIPLE SIGNAL RECEPTION AND TRANSMISSION USING FREQUENCY MULTIPLEXING AND SHARED PROCESSING

(75) Inventors: Robert B. Staszewski, Garland, TX (US); Khurram Muhammad, Dallas, TX (US); Dirk Leipold, Igis (CH)

(73) Assignee: Texas Instruments Incorporated, Dallas, TX (US)

( * ) Notice: Subject to any disclaimer, the term of this patent is extended or adjusted under 35 U.S.C. 154(b) by 298 days.

(21) Appl. No.: 12/250,646

(22) Filed: Oct. 14, 2008

(65) Prior Publication Data

US 2010/0091688 A1 Apr. 15, 2010

(51) Int. Cl.
*H04L 5/14* (2006.01)

(52) U.S. Cl.
USPC .......................................... 370/295

(58) Field of Classification Search
USPC ................. 370/276–277, 295, 297, 342–343, 370/537–538; 375/316, 347; 455/425, 73, 455/550.1, 553.1
See application file for complete search history.

(56) References Cited

U.S. PATENT DOCUMENTS

| | | | |
|---|---|---|---|
| 3,581,211 A | 5/1971 | Maitland et al. | 325/451 |
| 6,329,850 B1 | 12/2001 | Mair et al. | 327/107 |
| 6,809,598 B1 | 10/2004 | Staszewski et al. | 331/16 |
| 7,006,813 B2 | 2/2006 | Staszewski et al. | 455/323 |
| 7,057,540 B2 | 6/2006 | Muhammad et al. | 341/143 |
| 7,356,107 B2 | 4/2008 | Xiu et al. | 375/355 |
| 2004/0151257 A1 | 8/2004 | Staszewski et al. | 375/296 |
| 2005/0186920 A1 | 8/2005 | Staszewski et al. | 455/114.1 |
| 2005/0233725 A1 | 10/2005 | Muhammad et al. | 455/339 |
| 2005/0237233 A1 | 10/2005 | Muhammad | 341/143 |
| 2006/0033582 A1 | 2/2006 | Staszewski et al. | 331/16 |
| 2008/0096509 A1* | 4/2008 | Ling | 455/273 |

OTHER PUBLICATIONS

Muhammad et al, Digital RF Processing: Toward Low-Cost Reconfigurable Radios, IEEE, 9 pages, Aug. 2005.*
Staszewski et al, Digital RF Processor Techniques for Single-Chip Radios (Invited), IEEE, 8 pages, 2006.*
Campi et al, Baseband Analog Front-End and Digital Back-End for Reconfigurable Multi-Standard Terminals, IEEE ,21 pages, 2006.*
Staszewski et al, A First Digital-Controlled Oscillator in a Deep-Submicron CMOS Process for Multi-GHz Wireless Applications, IEEE, 4 pages, 2003.*
Muhammad et al, Direct RF Sampling Mixerwith Recursive Filtering in Charge Domain, IEEE, 4 pages, 2004.*
K. Muhammad et al., "The First Fully Integrated Quad-Bnad GSM/GPRS Receiver in a 90-nm Digital CMOS Process," IEEE J. of Solid State Circuits, vol. 41, No. 8, Aug. 2006, pp. 1772-1783.
L. Xiu et al., "A Novel All-Digital PLL With Software Adpative Filter," IEEE J. Solid State Circuits, vol. 39, No. 3, Mar. 2004, pp. 476-483.

* cited by examiner

*Primary Examiner* — Frank Duong
(74) *Attorney, Agent, or Firm* — Ronald O. Neerings; W. James Brady; Frederick J. Telecky, Jr.

(57) ABSTRACT

A novel mechanism for simultaneous multiple signal reception and transmission using frequency multiplexing and shared processing. Multiple RF signals, which may be of various wireless standards, are received using one or more shared processing blocks thereby significantly reducing chip space and power requirements. Shared components include local oscillators, analog to digital converters, digital RX processing and digital baseband processing. In operation, multiple RX front end circuits, one for each desired wireless signal, generate a plurality of IF signals that are frequency multiplexed and combined to create a single combined IF signal. The combined IF signal is processed by a shared processing block. Digital baseband processing is performed on each receive signal to generate respective data outputs. Further, simultaneous full-duplex transmission and reception is performed using a single local oscillator. The phase/frequency modulation of the frequency synthesizer used in the TX is removed from the local oscillator signal for use in the receiver.

44 Claims, 13 Drawing Sheets

US 8,542,616 B2

SIMULTANEOUS MULTIPLE SIGNAL RECEPTION AND TRANSMISSION USING FREQUENCY MULTIPLEXING AND SHARED PROCESSING

FIELD OF THE INVENTION

The present invention relates to the field of data communications and more particularly relates to a mechanism for simultaneous multiple signal reception and transmission using frequency multiplexing and shared processing.

BACKGROUND OF THE INVENTION

In conventional prior art receiver circuit design, receiving multiple signals simultaneously of possible different wireless standards requires multiple complete receiver circuits. Consider a first example prior art receiver capable of simultaneous multiple signal reception as shown in FIG. 1. The receiver, generally referenced 10, comprises two separate RX circuits each comprising antenna 12, analog front-end RX circuit 14 (analog RX1 and analog RX2), local oscillator 16 (LO1 and LO2), analog to digital converter 18 (ADC1 and ADC2), digital back-end RX circuit 20 (digital RX1 and digital RX2) and digital baseband circuit 22 (DBB1 and DBB2).

A diagram illustrating the frequency spectrum of two received RF signals and their corresponding local oscillator clock signals generated by the receiver is shown in FIG. 2. The RF1 signal 29 having center frequency $f_{c1}$ is mixed with local oscillator signal $f_{LO1}$ 28. Similarly, the RF2 signal 26 having center frequency $f_{c2}$ is mixed with local oscillator signal $f_{LO2}$ 24.

In operation, the first RX circuit receives an input signal RF1 and outputs a DATA_OUT1 signal. The local oscillator signal $f_{LO1}$ is used by analog RX1 circuit to downconvert the RF1 signal to an IF, of center frequency $f_{c1}$-$f_{LO1}$, or baseband signal. The second RX circuit receives an input signal RF2 and outputs a DATA_OUT2 signal. The local oscillator signal $f_{LO2}$ is used by analog RX2 circuit to downconvert the RF2 signal to an IF, of center frequency $f_{c2}$-$f_{LO2}$, or baseband signal. Thus, not only are separate LO circuits required in the circuit but separate complete receive paths are needed to process both RF signals.

A diagram illustrating the frequency spectrum of both RF signals after downconverting using respective local oscillator signals is shown in FIG. 3. The first RX circuit downconverts the RF1 signal 30 and then filters it using low pass filtering (LPF) 32. Similarly, the second RX circuit downconverts the RF2 signal 34 and then filters it using low pass filtering (LPF) 36.

The local oscillator (i.e. frequency synthesizer) design for RF applications, however, requires significant chip area and is very power intensive, especially in deep-submicron processes, due to the requirement of a high-Q inductor. Thus, eliminating a single inductor and associated synthesizer circuitry can potentially free up as much as 300K gates for other digital tasks, depending on the process technology used.

A block diagram illustrating a second example prior art transceiver incorporating separate receive and transmit local oscillators is shown in FIG. 4. The transceiver, generally referenced 40, comprises a duplexer 43 coupled to antenna 42, RX circuit 44 for receiving RF1 and generating DATA_OUT1, local oscillator (LO1) 45 generating $f_{LO1}$, TX circuit 46 for receiving DATA_IN2 and generating RF2 and local oscillator (LO2) 47. The transmitter may comprise a polar transmitter with phase/frequency modulation 48 applied to the local oscillator signal $f_{LO2}$. Note that two separate local oscillators 45 and 47 are used for both transmit and receiver circuits.

Normally, full-duplex wireless standards, such as WCDMA require simultaneous transmit and receive operations using a transceiver such as that shown in FIG. 4. To accommodate simultaneous transmission and reception, a frequency band separation is inserted between the transmit and receive frequency bands. This, however, requires two local oscillators which must be isolated in order to avoid any frequency pulling between each other. This is the case for wireless standards such as 3G and 4G, including LTE, WiMAX, WCDMA and other standards that utilize frequency division duplex (FDD) whereby the transmitter and receiver must operate at the same time.

As in the case of multiple simultaneous signal reception in the circuit of FIG. 1, the local oscillator circuit requires significant chip area and power consumption due to the need for a high-Q inductor. Therefore, eliminating the inductor and associated synthesizer circuitry can free up significant chip area and reduce power consumption.

There is thus a need for a receiver capable of simultaneous multiple signal reception that does not require the use of separate individual local oscillators for the reception of each RF signal. In addition, there is a need for a transceiver capable of simultaneous transmission and reception that does not require the use of separate individual local oscillators for transmitter and reception operation. There is a further need for a receiver capable of simultaneous multiple signal reception that does not require the use of separate individual receive paths.

SUMMARY OF THE INVENTION

The present invention is a novel mechanism for simultaneous multiple signal reception and transmission using frequency multiplexing and shared processing. The mechanism enables the simultaneous reception of multiple RF signals utilizing frequency multiplexing and shared processing. The multiple RF signals may be of various wireless standards. One or more receiver blocks in the receive signal path are shared among the various receive signals thus reducing chip space and power requirements. Components that are shared include local oscillators, analog to digital converters, digital RX processing and digital baseband processing.

In operation, multiple RX front end circuits, one for each desired wireless signal, generate a plurality of IF signals that are frequency multiplexed and combined to create a single combined IF signal. The combined IF signal is processed by a processing block that is shared for all IF signals. Digital baseband processing is performed on each receive signal to generate respective data outputs.

In addition, the mechanism permits the simultaneous full-duplex transmission and reception using a single local oscillator. The polar transmitter directly modulates phase/frequency of the frequency synthesizer which serves as the local oscillator. In order to use the local oscillator signal in the receiver, the phase/frequency TX modulation is removed using a multi-tap direct sampling mixer through a two dimensional transversal of its rotating capacitors which are capable of connecting to any of four history capacitors associated with each quadrature phase (i.e. I+, Q+, I−, Q−).

The mechanism of the present invention is particularly suitable for use in digital radios employing frequency division multiplexing (i.e. FDD) which normally require separate local oscillators for the transmitter and receiver. FDD based 3G and 4G technology includes, for example, wireless standards such as 3rd Generation Partnership Project (3GPP) Long Term Evolution (LTE), 3GPP2 Ultra Mobile Broadband (UMB), FDD variants of WiMAX, WCDMA, etc.

The simultaneous multiple signal reception and transmission mechanism of the invention is well-suited for use in transmitters and in particular, polar transmitter based systems, such as single-chip radio solutions based on Digital RF Processor or Digital Radio Processor (DRP) technology. Such systems permit the use of existing on-chip DRP resources, such as the script processor and other system components for implementation of the mechanism. An example DRP based radio is described in more detail infra.

Several advantages of the simultaneous multiple signal reception and transmission mechanism of the present invention include: (1) significant reductions in hardware and power consumption (i.e. chip area) due to the sharing of local oscillators, ADCs, receiver processing, etc.; (2) design flexibility as part of a DRP solution; (3) software programmability of one or more processing blocks; and (4) ability to realize single chip transceivers for multiple wireless standards (e.g., GSM and WCDMA).

Note that many aspects of the invention described herein may be constructed as software objects that are executed in embedded devices as firmware, software objects that are executed as part of a software application on either an embedded or non-embedded computer system running a real-time operating system such as WinCE, Symbian, OSE, Embedded LINUX, etc. or non-real time operating system such as Windows, UNIX, LINUX, etc., or as soft core realized HDL circuits embodied in an Application Specific Integrated Circuit (ASIC) or Field Programmable Gate Array (FPGA), or as functionally equivalent discrete hardware components.

There is thus provided in accordance with the present invention a method of multiple signal reception for use in a receiver (RX) having a plurality of RX front end modules, the method comprising the steps of combining outputs of the plurality of RX front end modules utilizing frequency division multiplexing to generate a combined intermediate frequency (IF) signal therefrom, processing the combined IF signal using at least one RX back end module to generate a plurality of data output signals thereby and wherein the number of RX back end modules is less than the number of front end modules.

There is also provided in accordance with the present invention an apparatus for multiple signal reception comprising a plurality of receiver (RX) front end circuits, each RX front end circuit operative to generate an intermediate frequency (IF) signal at a particular frequency band, a signal combiner operative to combine the plurality of IF signals using frequency division multiplexing to generate a combined IF signal thereby, at least one RX processing path operative to process the combined IF signal to generate a plurality of data output signals thereby and wherein the number of RX processing paths is less than the number of front end circuits.

There is further provided in accordance with the present invention a single chip radio apparatus comprising at least one transmitter, a plurality of RF front end receive (RX) circuits, each RX circuit operative to receive at least one wireless signal and to generate an intermediate frequency (IF) signal at a particular IF frequency band therefrom, a signal combiner coupled to the plurality of RF front end RX circuits, the signal combiner operative to combine the outputs of the plurality of RF front end RX circuits utilizing frequency division multiplexing to generate an analog combined IF signal therefrom, a single shared analog to digital converter operative to convert the analog combined IF signal into a digital combined IF signal therefrom and a receive processing path operative to filter and demodulate the digital combined IF signal and to generate a plurality of data output signals in response thereto.

There is also provided in accordance with the present invention a single chip radio apparatus comprising at least one transmitter, a plurality of RF front end receive (RX) circuits, each RX circuit comprising a dedicated analog to digital converter and operative to generate a digitized intermediate frequency (IF) signal at a particular IF frequency band, a signal combiner coupled to the plurality of RF front end RX circuits, the signal combiner operative to combine the digitized IF signals to generate a multiplexed IF signal therefrom and a single receive processing path operative to filter and demodulate the multiplexed IF signal and to generate a plurality of data output signals in response thereto.

There is further provided in accordance with the present invention a method of simultaneous full-duplex signal reception and transmission, the method comprising the steps of sharing a single local oscillator between a receiver and a polar transmitter, phase modulating the local oscillator to generate a modulated TX signal thereby and removing the phase modulation form the modulated TX signal for use as a local oscillator signal by the receiver.

There is also provided in accordance with the present invention a full-duplex transceiver comprising a local oscillator operative to be shared between a receiver and a polar transmitter, the transmitter comprising means for phase modulating the local oscillator, the receiver comprising means for removing phase modulation from the phase modulated local oscillator, a transmit processing path coupled to the transmitter and operative to generate a transmit signal in accordance with a signal input thereto and a receive processing path coupled to the receiver and operative to generate a data output signal thereby.

There is further provided in accordance with the present invention a full-duplex transceiver comprising a local oscillator operative to be shared between a receiver and a polar transmitter, the receiver coupled to the local oscillator operative to generate a first local oscillator clock signal and an edge synthesizer operative to receive the first local oscillator clock signal and to synthesize a second local oscillator clock signal therefrom.

BRIEF DESCRIPTION OF THE DRAWINGS

The invention is herein described, by way of example only, with reference to the accompanying drawings, wherein.

DETAILED DESCRIPTION OF THE INVENTION

Notation Used Throughout

Figure 1:
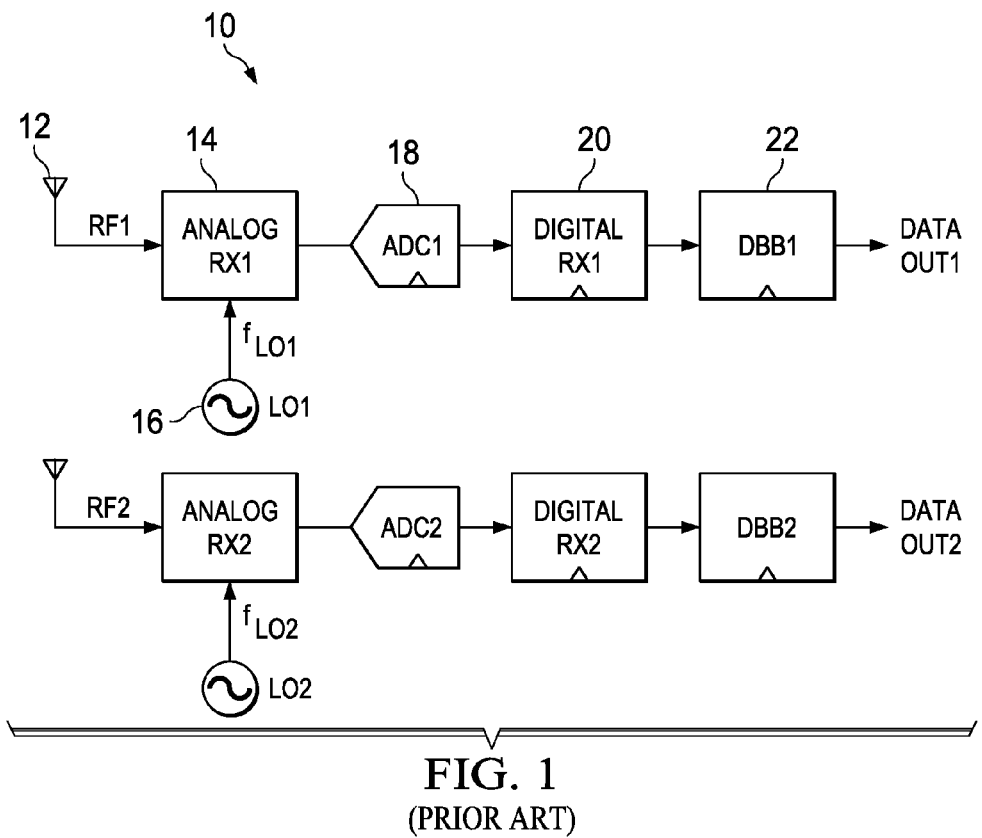
FIG. 1 is a block diagram illustrating a first example prior art receiver capable of simultaneous multiple signal reception.

The following notation is used throughout this document.

| Term | Definition |
|---|---|
| 3GPP | 3rd Generation Partnership Project |
| AC | Alternating Current |
| ADC | Analog to Digital Converter |
| ADPLL | All Digital Phase Locked Loop |
| AM | Amplitude Modulation |
| ASIC | Application Specific Integrated Circuit |
| AVI | Audio Video Interleave |
| BIST | Built-In Self Test |
| BMP | Windows Bitmap |
| CDMA | Code Division Multiple Access |
| CIC | Cascaded Integrator-Comb |
| CMOS | Complementary Metal Oxide Semiconductor |
| CPU | Central Processing Unit |
| CSF | Channel Select Filter |
| DAC | Digital to Analog Converter |
| DBB | Digital Baseband |
| DC | Direct Current |
| DCO | Digitally Controlled Oscillator |
| DCU | Digital Control Unit |
| DIGOC | COordinate Rotation DIgital Computer |
| DRP | Digital RF Processor or Digital Radio Processor |
| DSL | Digital Subscriber Line |
| DSP | Digital Signal Processing |
| EDGE | Enhanced Data rates for GSM Evolution |
| EPROM | Erasable Programmable Read Only Memory |
| FCU | Feedback Control Unit |
| FCW | Frequency Command Word |
| FDD | Frequency Division Duplex |
| FEM | Front End Module |
| FIR | Finite Impulse Response |
| FM | Frequency Modulation |
| FPGA | Field Programmable Gate Array |
| FREF | Frequency Reference |
| GGE | GSM/GPRS/EDGE |
| GPRS | General Packet Radio Service |
| GPS | Global Positioning Satellite |
| GSM | Global System for Mobile Communications |
| HB | High Band |
| HDL | Hardware Description Language |
| IEEE | Institute of Electrical and Electronic Engineers |
| IFIC | Integrated Circuit |
| IIR | Infinite Impulse Response |
| JPG | Joint Photographic Experts Group |
| LAN | Local Area Network |
| LB | Low Band |
| LDO | Low Drop Out |
| LFC | Loop Filter Control |
| LMS | Least Mean Squares |
| LNA | Low Noise Amplifier |
| LNTA | Low Noise Transconductance Amplifier |
| LO | Local Oscillator |
| LPF | Low Pass Filter |
| LTE | Long Term Evolution |
| MAC | Media Access Control |
| MIM | Metal Insulator Metal |
| MOS | Metal Oxide Semiconductor |
| MOSCAP | MOS Capacitor |
| MP3 | MPEG-1 Audio Layer 3 |
| MPG | Moving Picture Experts Group |
| MTDSM | Multi-Tap Direct Sampling Mixer |
| OFDM | Orthogonal Frequency Division Multiplexing |
| OFDMA | Orthogonal Frequency Division Multiple Access |
| PAE | Power-Added Efficiency |
| PAR | Peak-To-Average Ratio |
| PC | Personal Computer |
| PDA | Personal Digital Assistant |
| PLL | Phase Locked Loop |
| PM | Phase Modulation |
| PPA | Pre-Power Amplifier |
| RAM | Random Access Memory |
| RAT | Radio Access Technology |
| RAT | Radio Access Technology |
| RC | Raised Cosine |
| RCF | Rate Change Filter |
| RF | Radio Frequency |
| RFBIST | RF Built-In Self Test |
| ROM | Read Only Memory |
| RX | Receiver |
| SIM | Subscriber Information Module |
| SPI | Serial Peripheral Interface |
| TDC | Time-to-Digital Converter |
| TDD | Time Division Duplex |
| TX | Transmitter |
| UMB | Ultra Mobile Broadband |
| USB | Universal Serial Bus |
| UWB | Ultra Wideband |
| VCO | Voltage Controlled Oscillator |
| VGA | Variable Gain Amplifier |
| WCDMA | Wideband Code Division Multiple Access |
| WiMAX | World Interoperability for Microwave Access |
| WLAN | Wireless Local Area Network |
| WMA | Windows Media Audio |
| WMV | Windows Media Video |
| WPAN | Wireless Personal Area Network |

DETAILED DESCRIPTION OF THE INVENTION

The present invention is a novel mechanism for simultaneous multiple signal reception and transmission using frequency multiplexing and shared processing. The mechanism enables the simultaneous reception of multiple RF signals utilizing frequency multiplexing and shared processing. The multiple RF signals may be of various wireless standards. One or more receiver blocks in the receive signal path are shared among the various receive signals thus reducing chip space and power requirements. Components that are shared include local oscillators, analog to digital converters, digital RX processing and digital baseband processing.

In addition, the mechanism permits the simultaneous full-duplex transmission and reception using a single local oscillator. The polar transmitter directly modulates phase/frequency of the frequency synthesizer which serves as the local oscillator. In order to use the local oscillator signal in the receiver, the phase/frequency TX modulation is removed using a multi-tap direct sampling mixer through a two dimensional transversal of its rotating capacitors which are capable of connecting to any of four history capacitors associated with each quadrature phase (i.e. I+, Q+, I−, Q−).

The mechanism of the present invention is particularly suitable for use in digital radios employing frequency division multiplexing (i.e. FDD) which normally require separate local oscillators for the transmitter and receiver. FDD based 3G and 4G technology includes, for example, wireless standards such as 3rd Generation Partnership Project (3GPP) Long Term Evolution (LTE), 3GPP2 Ultra Mobile Broadband (UMB), FDD variants of WiMAX, WCDMA, etc.

The simultaneous multiple signal reception and transmission mechanism of the invention is well-suited for use in FDD based transceivers and in particular, polar transmitter based systems, such as single-chip radio solutions based on Digital RF Processor or Digital Radio Processor (DRP) technology. Note that although the invention is suitable for use in a digital radio transceiver incorporating a polar transmitter it can be used in other applications as well, such as in a digital transmitter operating in Cartesian coordinates and in general communication channels.

To aid in understanding the principles of the present invention, one or more embodiments are described in the context of a digital RF processor (DRP) based transmitter having a polar architecture that may be adapted to comply with a particular wireless communications standard such as GSM, GPRS, EDGE, Bluetooth, WCDMA, WLAN, WiMax, etc. It is appreciated, however, that the invention is not limited to use with any particular communication standard and may be used in optical, wired and wireless applications. Further, the invention is not limited to use with a specific modulation scheme but is applicable to any modulation scheme including both digital and analog modulations.

Although the simultaneous multiple signal reception and transmission mechanism is applicable to numerous wireless communication standards and can be incorporated in numerous types of wireless or wired communication devices such as a multimedia player, mobile station, user equipment, cellular phone, PDA, DSL modem, WPAN device, etc., it is described in the context of a digital RF processor (DRP) based transceiver. It is appreciated, however, that the invention is not limited to use with any particular communication standard and may be used in optical, wired and wireless applications. Further, the invention is not limited to use with a specific modulation scheme but may be applicable to many digital modulation schemes where there is a need to improve the power efficiency of transmitters.

Note that throughout this document, the term communications device is defined as any apparatus or mechanism adapted to transmit, receive or transmit and receive data through a medium. The term communications transceiver or communications device is defined as any apparatus or mechanism adapted to transmit and receive data through a medium. The communications device or communications transceiver may be adapted to communicate over any suitable medium, including wireless or wired media. Examples of wireless media include RF, infrared, optical, microwave, UWB, Bluetooth, WiMAX, WiMedia, WiFi, or any other broadband medium, etc. Examples of wired media include twisted pair, coaxial, optical fiber, any wired interface (e.g., USB, Firewire, Ethernet, etc.). The term Ethernet network is defined as a network compatible with any of the IEEE 802.3 Ethernet standards, including but not limited to 10Base-T, 100Base-T or 1000Base-T over shielded or unshielded twisted pair wiring. The terms communications channel, link and cable are used interchangeably. The notation DRP is intended to denote either a Digital RF Processor or Digital Radio Processor. References to a Digital RF Processor infer a reference to a Digital Radio Processor and vice versa.

The term multimedia player or device is defined as any apparatus having a display screen and user input means that is capable of playing audio (e.g., MP3, WMA, etc.), video (AVI, MPG, WMV, etc.) and/or pictures (JPG, BMP, etc.). The user input means is typically formed of one or more manually operated switches, buttons, wheels or other user input means. Examples of multimedia devices include pocket sized personal digital assistants (PDAs), personal media player/recorders, cellular telephones, handheld devices, and the like.

Some portions of the detailed descriptions which follow are presented in terms of procedures, logic blocks, processing, steps, and other symbolic representations of operations on data bits within a computer memory. These descriptions and representations are the means used by those skilled in the data processing arts to most effectively convey the substance of their work to others skilled in the art. A procedure, logic block, process, etc., is generally conceived to be a self-consistent sequence of steps or instructions leading to a desired result. The steps require physical manipulations of physical quantities. Usually, though not necessarily, these quantities take the form of electrical or magnetic signals capable of being stored, transferred, combined, compared and otherwise manipulated in a computer system. It has proven convenient at times, principally for reasons of common usage, to refer to these signals as bits, bytes, words, values, elements, symbols, characters, terms, numbers, or the like.

It should be born in mind that all of the above and similar terms are to be associated with the appropriate physical quantities they represent and are merely convenient labels applied to these quantities. Unless specifically stated otherwise as apparent from the following discussions, it is appreciated that throughout the present invention, discussions utilizing terms such as 'processing,' 'computing,' 'calculating,' 'determining,' 'displaying' or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The invention can take the form of an entirely hardware embodiment, an entirely software embodiment or an embodiment containing a combination of hardware and software elements. In one embodiment, a portion of the mechanism of the invention is implemented in software, which includes but is not limited to firmware, resident software, object code, assembly code, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium is any apparatus that can contain, store, communicate, propagate, or transport the program for use by or in connection with the instruction execution system, apparatus, or device, e.g., floppy disks, removable hard drives, computer files comprising source code or object code, flash semiconductor memory (USB flash drives, etc.), ROM, EPROM, or other semiconductor memory devices.

Simultaneous Multiple Signal Reception and Transmission Mechanism

As stated supra, the present invention is a mechanism for simultaneous multiple signal reception and transmission using frequency multiplexing and shared processing. The mechanism enables the simultaneous reception of multiple RF signals utilizing frequency multiplexing and shared processing.

Figure 5:
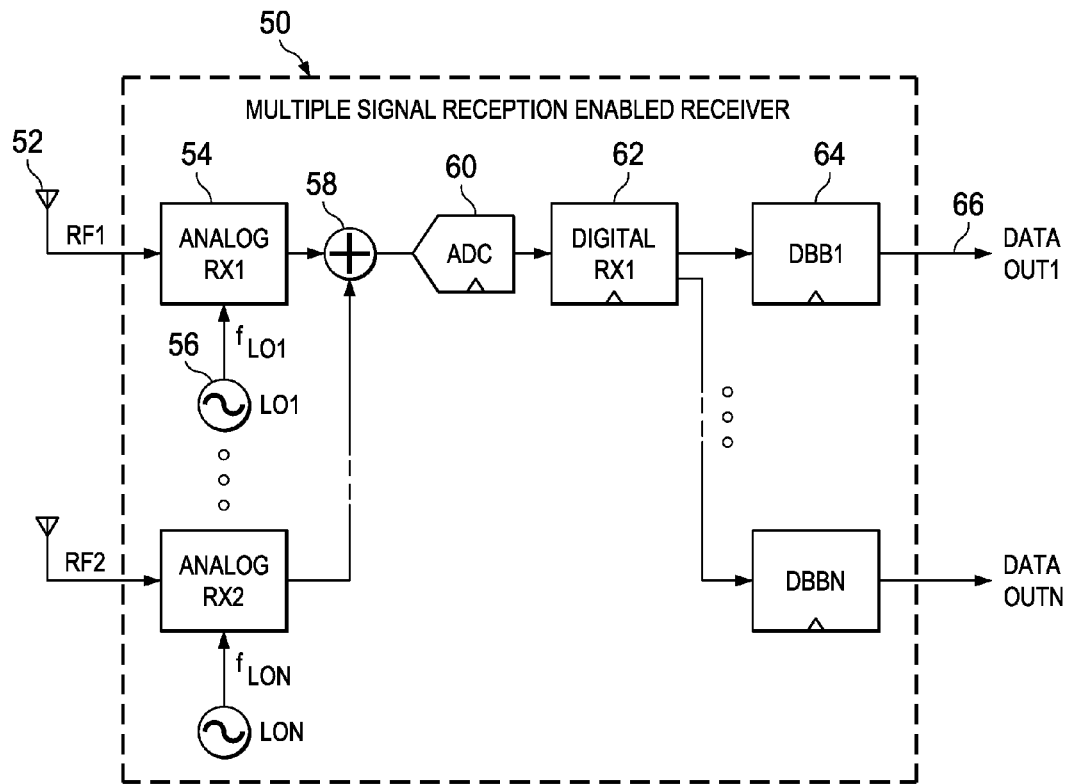
FIG. 5 is a block diagram illustrating a first example receiver capable of simultaneous multiple signal reception constructed in accordance with the present invention.

A block diagram illustrating a first example receiver capable of simultaneous multiple signal reception constructed in accordance with the present invention is shown in FIG. 5. The multiple signal reception enabled receiver, generally referenced 50, comprises a plurality of N front end circuits each comprising an analog RX circuit 54 coupled to an antenna 52 and a dedicated local oscillator (LO) 56, a signal combiner 58, analog to digital converter (ADC) 60, digital RX processing block 62 and N digital baseband (DBB) processing blocks 64.

In operation, each front end circuit is dedicated to reception of a particular wireless signal. Any number of the wireless signals may conform to a known wireless standard. Further, one of the front end circuits may be dedicated to receiving signals for the linearization of transmitter components. In this case, the transmitter path comprises a digital predistorter that predistorts (i.e. calibrates) the digital input to mitigate nonlinearities associated with a power amplifier. The transceiver circuit comprises a receiver path associated with the digital transmitter path. A coupling element provides a signal from the transmitter path to the receiver path. A signal evaluator determines values for one or more parameters associated with the digital predistorter based on the signal. A more detailed description of the predistortion calibration mechanism suitable for use with the present invention is described in U.S. Publication No. 2004/0151257, to Staszewski et al., entitled "Predistortion calibration in a transceiver assembly," incorporated herein by reference in its entirety. Furthermore, one or more of the front end circuits may be dedicated to uses other than wireless reception. For example, it could be used to receive a test signal or an auxiliary signal.

A dedicated LO generates a local oscillator signal $f_{LOx}$ (x=1 ... N) used by the analog RX circuit to downconvert the RF signal from the antenna to a particular intermediate frequency (IF). The IF frequencies (or frequency bands) are selected such that when the individual IF signals are combined they can subsequently be separated after RX and baseband processing. Thus, the individual IF signals output of the RX front end circuits are frequency division multiplexed into a single combined IF signal via combiner 58.

The ADC runs at a sufficiently high sample rate clock (e.g., >600 MHz) to provide an incredibly high oversampling ratio of >1000 for a GSM signal with bandwidth of 200 kHz, for example. The digital decimating filters in the digital RX circuit comprise an extremely high attenuation slope in the transition band region between pass-band and stop-band. Although normally realized as low-pass filters, with such a high ADC oversampling ratio, one or more additional IF signals are added to the first signal in a frequency division multiplexing manner in accordance with the invention. The frequency band of the added IF signals lie higher than that of the first signal wherein all the signals are separated by a buffer band sufficiently wide enough for the digital decimation filters to handle it effectively. The decimation filters required for the added IF signals are of bandpass characteristic. Up until processing in the digital RX circuit (i.e. decimating filters), all the IF signals are inseparable and considered one signal of larger bandwidth. Note also that negative frequencies for I/Q signaling can be handled as well.

Figure 2:
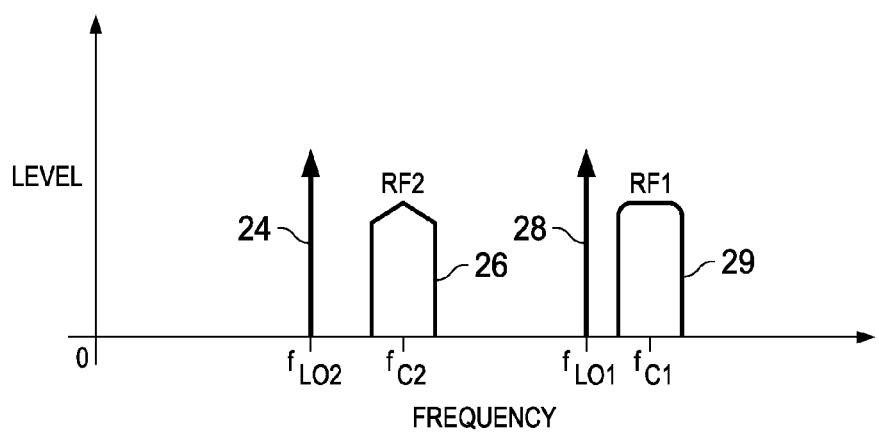
FIG. 2 is a diagram illustrating the frequency spectrum of two received RF signals and their corresponding local oscillator signals generated by the receiver.
Figure 3:
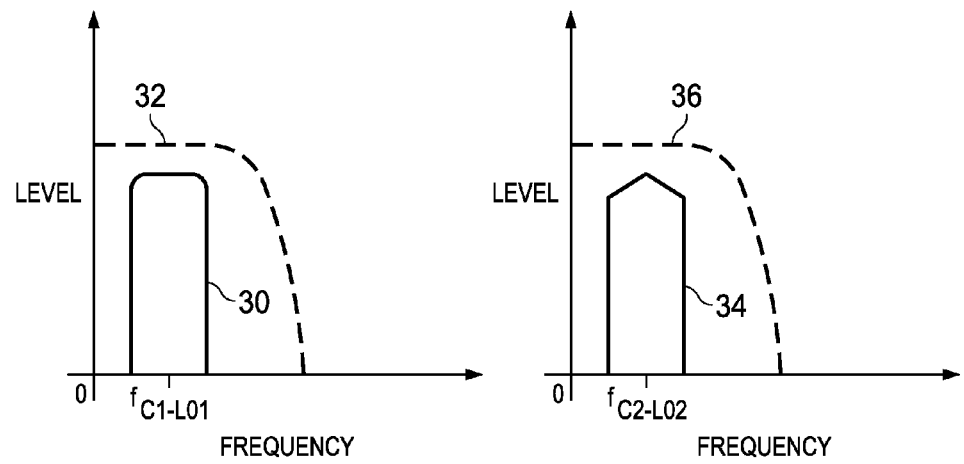
FIG. 3 is a diagram illustrating the frequency spectrum of both RF signals after downconverting using respective local oscillator signals.
Figure 4:
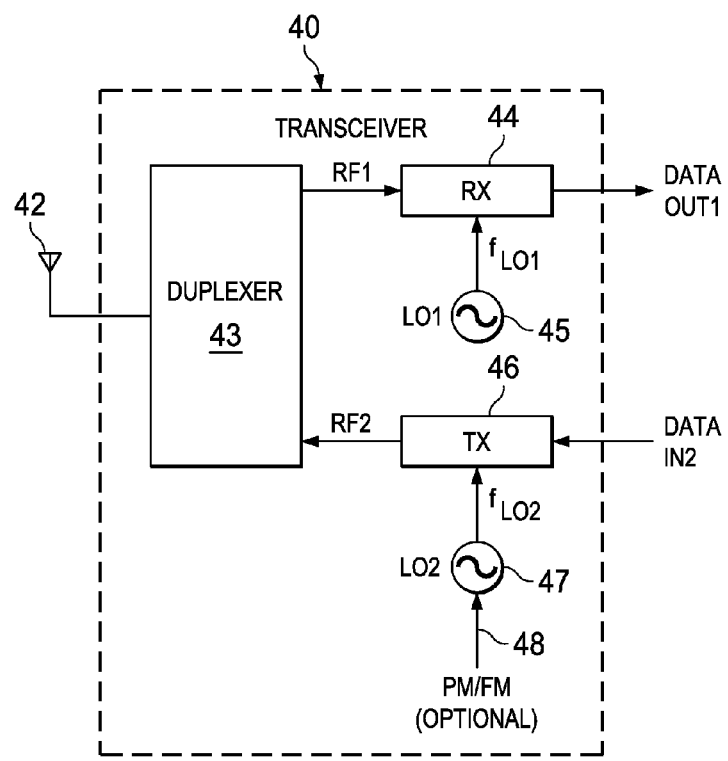
FIG. 4 is a block diagram illustrating a second example prior art transceiver incorporating separate receive and transmit local oscillators.
Figure 6:
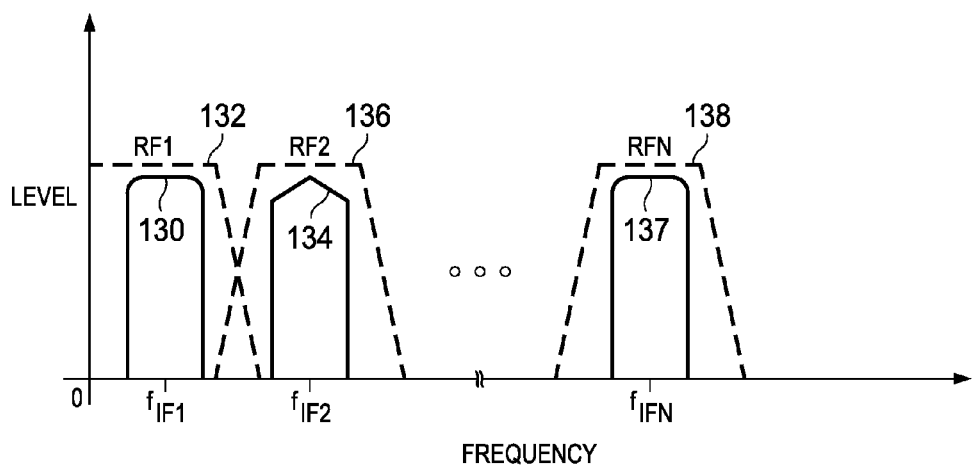
FIG. 6 is a diagram illustrating the frequency spectrum of the combined IF signal output of the combiner of the receiver of the present invention.

A diagram illustrating the frequency spectrum of the combined IF signal output of the combiner of the receiver of the present invention is shown in FIG. 6. It is assumed that RF1 and RF2 are as shown in FIG. 2. After frequency multiplexing, RF1 130 is centered at IF frequency $f_{IF1}$, RF2 134 at $f_{IF2}$ and RFN 137 at $f_{IFN}$. The digital RX processing 62 functions to filter each RF signal. Low pass filtering (typically complex low pass filtering for the non-zero-IF scheme) is used for RF1, while band pass filtering (typically complex) is used for signals RF2 to RFN. The frequency response shapes of each of the filters are indicated by the dotted lines, wherein 132 represents the low pass filter for RF1, 136 the bandpass filter for RF2 and 138 the bandpass filter for RFN.

The ADC 60 coverts the analog combined IF signal to the digital domain. Digital RX processing 62 performs decimation and filtering. The digital baseband blocks 64 demodulate each individual signal to generate separate data output signals 66. Note that the digital baseband processing may be implemented entirely in software, hardware or a combination thereof. If implemented in software, the baseband processing tasks performed for each signal can be implemented as a series of serial tasks, parallels tasks or a combination thereof.

Figure 7:
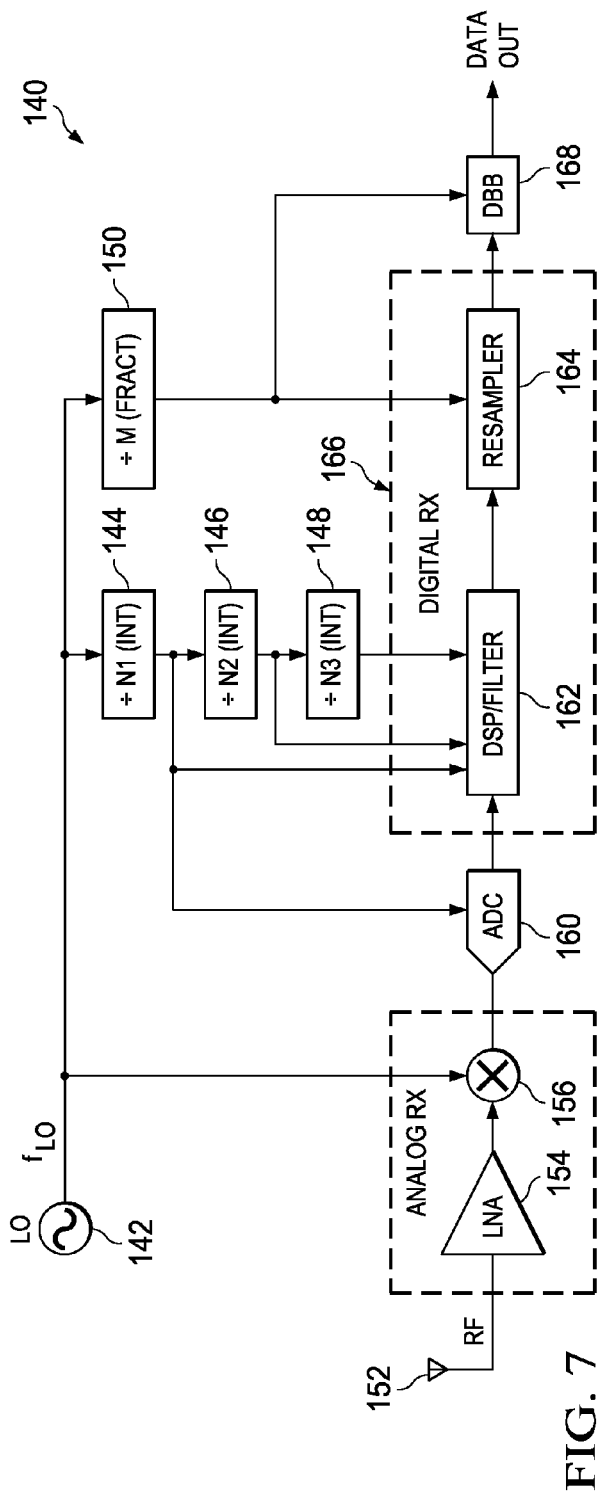
FIG. 7 is a block diagram illustrating an example clock divider circuit suitable for use with the present invention.

A block diagram illustrating an example clock divider circuit suitable for use with the present invention is shown in FIG. 7. The clock divider circuit provides the ability to generate an arbitrary frequency clock by dividing the RF oscillator edges using a fractional-N divider. The circuit comprises utilizing the directly derived RF oscillator clock whereby the digital receive data path circuitry is operated on a simple divide by integer-N clock. The sample rate conversion from a channel dependent rate to a fixed rate of the symbol multiple is performed by an interpolator or resampler. All the clocks used are generated using an integer or fractional division of the local oscillator. Portions of the receive chain are shown to aid in understanding the operation of the clock divider circuit.

The circuit, generally referenced 140, connects to an antenna 152, and comprises an analog RX circuit 158 comprising a low noise amplifier (LNA) or low noise transconductance amplifier (LNTA) 154 and mixer 156, an analog filter and optional variable gain amplifier (VGA) (not shown), analog to digital converter (ADC) 160, digital RX block 166 comprising digital signal processor (DSP)/filter 162 and resampler block 164, digital baseband (DBB) block 168, local oscillator (LO) 142, integer clock dividers 144, 146, 168 and fractional (also possible integer) divider 150. A key feature of the circuit 140 is that all the digital circuitry is synchronous and operates off clocks that are derived from or synchronous to the RF local oscillator 142 clock ($f_{LO}$). Using clocks that are directly derived from the RF oscillator clock by clock edge division simplifies data handoff between various clock domains and prevents injection pulling forces from arising.

Considering a cellular application as an example, the LO frequency is c. 2,000 MHz and $N_1=N_2=4$ and $N_3=64$. Assume a 2 GHz signal is received at the antenna 152 and input to the LNA 154. The output of the LNA is mixed down to a low IF frequency on the order of 100 kHz which is input to the sigma-delta ADC 160 which might operate at a very high frequency such as c. 500 MHz, for example. This results in a large oversampling ratio of about 1000. Decimation is then performed (in the digital RX 166) to reduce the high sample data rate from 500 MHz to about 2 MHz. Preferably, the decimation is performed using powers of two, simplifying the clock generation. The disadvantage of the sampling rate (i.e. ~2 MHz) of the DSP/filter is that it is channel dependent. Therefore, if, for example, the channel frequency changes by 200 kHz, the sampling rate will track it due to the divide by 1024 (4×4×64) relationship. Thus, a change in the channel frequency of 200 kHz would result in a change in the sampling rate at the DSP of about 200 Hz.

Note that the decimated frequencies are all created by edge division of the variable LO clock $f_{LO}$ hence they are synchronous to the LO clock. Thus, the use of the fixed rate frequency reference clock is avoided altogether thus avoiding the problems associated with injection pulling caused by use of the frequency reference clock which would degrade the performance of the transmitter and receiver. Integer divisions of the LO clock result in a digital data stream whose sample rate is channel dependent. The instantaneous frequency is not fixed causing the sampling rate to vary. For a given channel, however, it is fixed. For different channels, the sampling rate can change hundreds of kilohertz but stays a relatively fixed 2 MHz without much variation. The sampling rate can be made channel independent by adjusting the sample rate using a resampler 164 driven by a fractional-M divider 150. The fractional divider compensates for the use of a variable clock in the receiver circuitry rather than a fixed clock.

If the LO frequency increases, then the sampling rate at the DSP will be somewhat higher and in order to maintain the same frequency at the output, the fractional division ratio at the resampler is reduced proportionately. The resampler functions to convert the channel dependent data stream to a fixed symbol rate data stream using well-known interpolation techniques. The fractional-M divider generates an average fractional frequency clock equal to the symbol rate multiple whose edges are obtained by integer division.

It is possible to generate a constant rate clock at the output of the resampler while the input clock is directly derived from the LO and at the same time ensure that the rising edges of the constant rate clock only occur in synchronism with the rising edges of the LO. This elaborates the concept of synchronous fractional division. The main idea is that the output clock rate is maintained to a fixed value by dropping pulses of input clock such that on an average a fixed constant rate output clock is obtained. A counter counts the number of clocks at the input side and its count value is used to drop pulses at the output of a divider. The divider operates in synchronism to the LO but misses pulses at the output such that a constant rate is maintained at the output. The key fact is that the clocks derived from this method by integer divisions on the output side of the resampler will have rising edges aligned and synchronous with the rising edges of the LO. Despite, for any LO frequency, we can still obtain the same constant output rate by dropping appropriate number of pulses.

Additional details describing the operation of the clock divider circuit can be found in U.S. Publication No. 2005/0186920, to Staszewski et al., entitled "Apparatus For And Method Of Noise Suppression And Dithering To Improve Resolution Quality In A Digital Radio RF Processor," incorporated herein by reference in its entirety.

Figure 8:
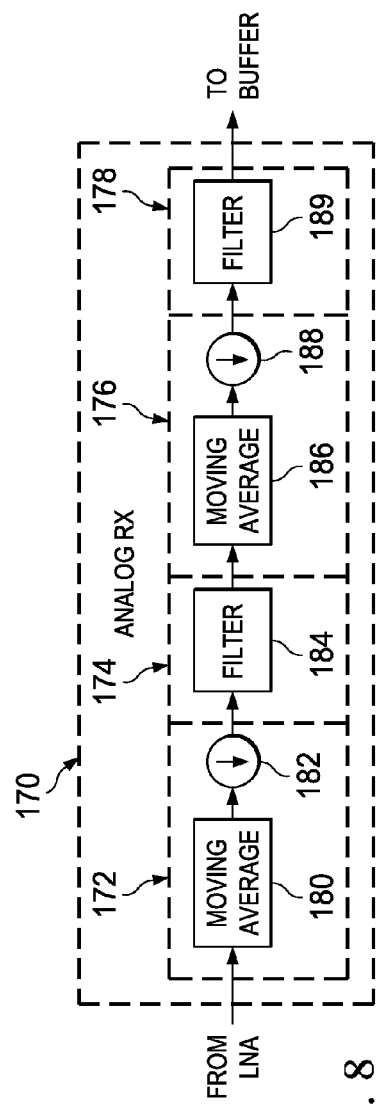
FIG. 8 is a signal processing diagram illustrating an example analog RX operation suitable for use with the present invention.

A signal processing diagram illustrating an example analog RX operation suitable for use with the present invention is shown in FIG. 8. The analog RX circuit model, generally referenced 170, implements a current-mode sampling mixer grouped by the signal processing steps that it performs. The signal processing performed by the mixer can be logically viewed as four distinct FIR/IIR filtering operations. A first FIR filtering operation 172 comprises a moving average operation 180 and a decimation operation 182. The moving average and decimation operations are the result of the integrating of N consecutive cycles of the RF current by a single capacitor. A second filtering operation 174 comprises an IIR filtering operation (via filter 184) and referred to as an IIR-1 operation. The IIR-1 filtering operation arises from the presence of the history capacitor and the continuous integration of the RF current by the history capacitor and its use in conjunction with rotating capacitors. The filtering operation 184 is determined by the ratio of the history capacitor, $C_H$, to the value of the rotating capacitors, $C_R$. The IIR-1 filtering operation has a pole at $1/(1-a_1)$, where $a_1$ is a number smaller than 1.

A third filtering operation 176 is a second FIR filtering operation that comprises a second moving average operation 186 and a second decimation operation 188. These two operations result from the configuration and arrangement of rotating and buffer capacitors. The second moving average and decimation operations 186 and 188 are directly dependent on the number of rotating capacitors in a rotating capacitor bank. In the case of four capacitors in the rotating capacitor bank, the moving average operation 186 is a moving average of four and the decimation operation 188 is a decimation by four.

Finally, a fourth filtering operation 178, an IIR filtering operation referred to as an IIR-2 operation, also arises from the configuration of the rotating and buffer capacitors. The IIR-2 operation is achieved at the end of the charge dump phase, when the rotating capacitor is disconnected from the buffer capacitor and any remaining charge on the rotating capacitor is reset prior to returning to actively integrating the RF current. It is the resetting of the charge that gives rise to the IIR-2 operation. The filtering operation 189 has a pole at $1/(1-a_2)$, where $a_2$ is defined as $C_B/(C_B+M^*C_R)$, where $C_B$ is the value of the buffer capacitor and $M^*C_R$ is the number of capacitors in a rotating capacitor bank (M) multiplied by the value of a rotating capacitor ($C_R$). The behavior can be expressed as follows $z_k = a_2(z_{k-1}+y_k) = a_2 z_{k-1} + a_2 y_k$, where $y_k$ is the input charge and $z_k$ is the charge stored on the buffer capacitor $C_B$ at sampling time k. As discussed previously, a bias voltage may be developed onto the rotating capacitors Additional details describing the operation of the analog RX can be found in U.S. Pat. No. 7,006,813, to Staszewski et al., entitled "Efficient Charge Transfer Using A Switched Capacitor Resistor," incorporated herein by reference in its entirety.

Figure 9:
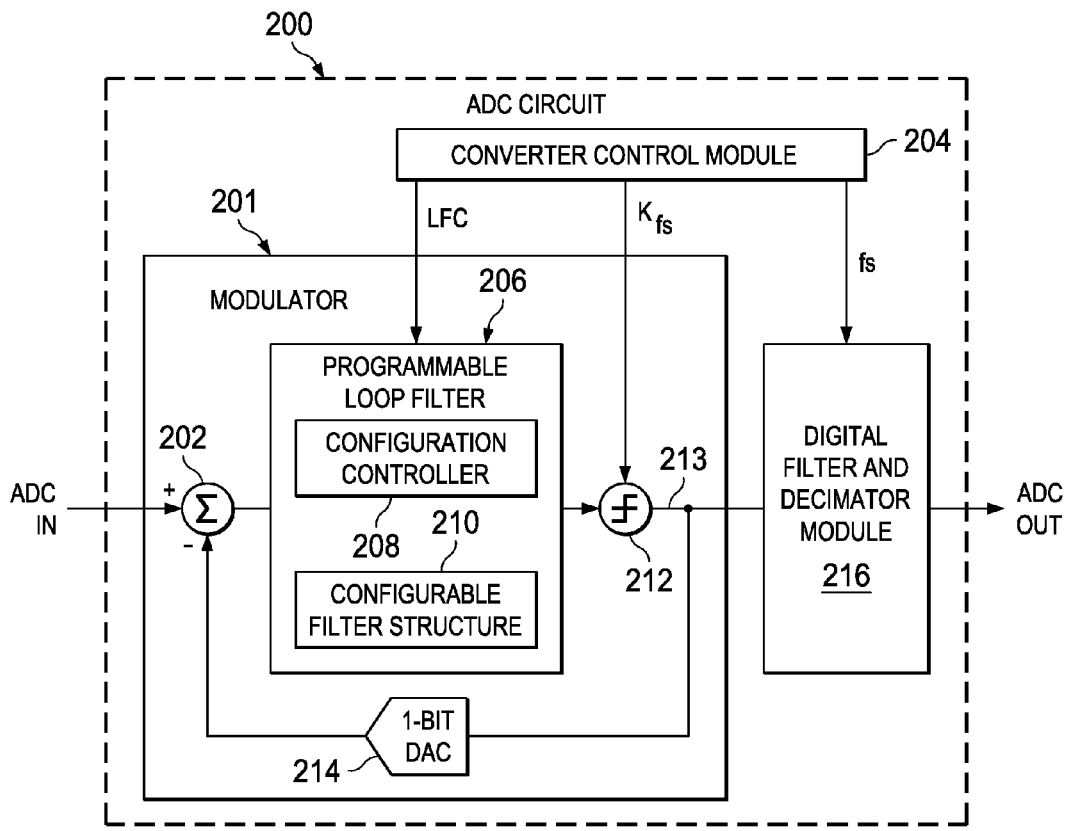
FIG. 9 is a block diagram illustrating an example analog to digital converter (ADC) circuit suitable for use with the present invention.

A block diagram illustrating an example high-speed analog to digital converter (ADC) circuit suitable for use with the present invention is shown in FIG. 9. The sigma-delta analog-to-digital converter (ADC), generally referenced 200, comprises modulator 201 operative to receive an input signal voltage ADC_IN, a digital filter and decimator module 216 operative to provide a converter output signal ADC_OUT and a converter control module 204. The modulator 201 comprises summing junction 202, programmable loop filter 206, one-bit quantizer 212 and a one-bit digital to analog converter (DAC) 214. The programmable loop filter 206 comprises configuration filter structure 210 and configuration controller 208.

In operation, the sigma delta ADC 200 converts the input signal voltage ADC_IN into the converter output signal ADC_OUT. The modulator 201 quantizes the input signal voltage ADC_IN and provides an oversampled digital modulator output signal 213 to the digital filter and decimator module 216. An oversampling frequency $Kf_s$ for the one-bit quantizer and a sampling frequency $f_s$ for the digital filter and decimator module are provided by the converter control module. These are determined by a required bit resolution of the conversion and a highest frequency associated with the input signal voltage ADC_IN, respectively. The modulator output signal 213 provides a serial bitstream that produces one bit for each period of the oversampling frequency $Kf_s$. This is transformed for the converter output signal ADC_OUT into a parallel digital word having N bits for each period of the sampling frequency $f_s$, where N is the number of bits associated with the conversion.

The modulator receives the input signal voltage ADC_IN employing the summing junction 202. The output of the summing junction is an average error signal between the input signal voltage ADC_IN and the output of the one-bit DAC, which reflects the inverse of the state of the oversampled digital signal 213. The programmable loop filter 206 processes this average error signal for quantization by the one-bit quantizer 212.

The programmable loop filter employs the configurable filter structure 210, which contains selectably interconnectable alternative filter elements, to form a transfer characteristic that includes a low pass frequency response. Additionally, the programmable loop filter couples the configuration controller 208 to the configurable filter structure 210 and interconnects at least one of the filter elements thereby determining at least one pole of the transfer characteristic of the configurable filter structure. This action is initiated by a loop filter control signal LFC from the converter control module 204 and sets an operating condition of the sigma-delta ADC. The operating condition may accommodate a particular application employing an industry standard, such as Bluetooth support in a Global System for Mobile Communications (GSM) receiver. Additionally, one or more industry standards may also be employed to tune the sigma delta ADC for best performance within a desired bandwidth. Note that by changing the clock rate or/and the transfer characteristic of the programmable loop filter, the signal-to-quantization noise ratio of the sigma delta ADC may be enhanced thereby increasing its overall signal-to-noise ratio and dynamic range for the particular application or a combination of applications.

Alternative embodiments of a sigma delta ADC may be constructed. For example, the feedback employed may be multi-bit using a multi-bit DAC wherein the associated bit stream becomes a symbol stream. In addition, more than one feedback loop may be employed wherein the feedback provided is single bit, multi-bit or a combination of the two. Additionally, the configurable filter structure may employ one or more low pass or bandpass filters wherein at least a selected one the filter elements is operable to be interconnected by a configuration controller. Further, a plurality of summing junctions or summing nodes may be employed that are typically separated by one or more programmable filters.

Additional details describing the operation of the ADC can be found in U.S. Publication No. 2005/0237233, to Muhammad, entitled "Programmable Loop Filter For Use With A Sigma Delta Analog-To-Digital Converter And Method Of Programming The Same," incorporated herein by reference in its entirety.

Figure 10:
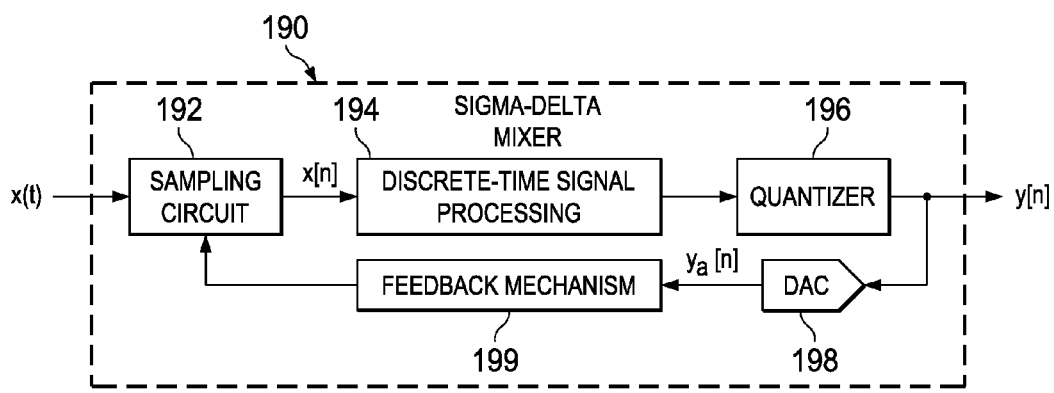
FIG. 10 is a block diagram illustrating an example sigma-delta mixer circuit suitable for use with the present invention.

A block diagram illustrating an example sigma-delta mixer circuit suitable for use with the present invention is shown in FIG. 10. The sigma-delta mixer, generally referenced 190, comprises switched capacitor sampling circuit 192, discrete-time signal processing block 194, quantizer 196, DAC 198 and feedback mechanism block 199. The sigma-delta mixer 190 is constructed based on using switched capacitors. Note that the term "sigma-delta ADC with a mixer" is used interchangeably with "sigma-delta mixer."

In operation, the sampling circuit is operative to convert a continuous-time analog signal x(t), into a discrete-time sample stream x[n]. The discrete-time sample stream x[n] is input to the discrete-time signal processing unit, whose function include gain control and/or filtering. Note that depending upon the filtering performed in the discrete-time signal processing unit, the order of the sigma-delta mixer can vary. If the discrete-time signal processing unit 194 performs first order integration, then the sigma-delta mixer behaves similarly to a first order sigma-delta ADC. After being filtered (with optional gain control), the discrete-time sample stream is forwarded to the quantizer 196.

The quantizer may comprise a single or a multi-bit quantizer. A single-bit quantizer is operative to convert a sample value into one of two values, typically either a+1 or a−1, depending on the value of the sample. The output of the quantizer is a digital data stream y[n] which also constitutes the output of the sigma-delta mixer. In addition to being the output of the sigma-delta mixer, the output of the quantizer is fedback to the sampling circuit 192 for use in generating subsequent outputs of the sigma-delta mixer.

The digital data stream y[n] is fed back to the sigma-delta mixer through a feedback loop. The feedback loop comprises a digital-to-analog converter (DAC) 198. The DAC converts the digital data stream y[n] into a discrete-time analog sample stream, $y_a[n]$. The discrete-time sample stream is then input to feedback mechanism 199 and then to sampling circuit 192 that functions to combine the discrete-time sample stream $y_a[n]$ with the discrete-time sample stream of the input signal x(t). Since the sampling circuit employs switched capacitors, the combination of the two discrete-time sample streams ($y_a[n]$ and x(t)) is not accomplished using simple addition or subtraction of the two discrete-time sample streams.

Additional details describing the operation of the sigma-delta mixer can be found in U.S. Pat. No. 7,057,540, to Muhammad, entitled "Sigma-delta (ΣΔ) Analog-To-Digital Converter (ADC) Structure Incorporating A Direct Sampling Mixer," incorporated herein by reference in its entirety.

Figure 11:
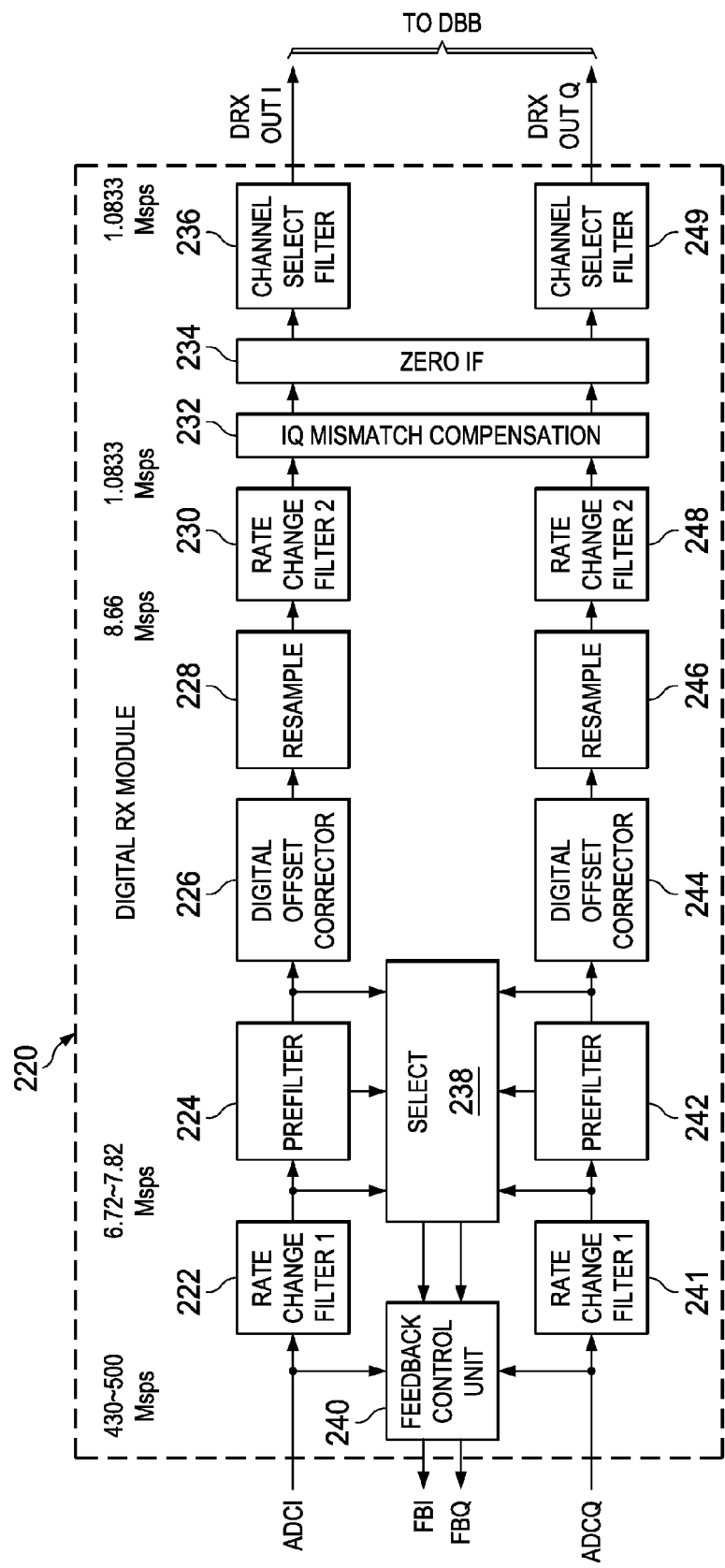
FIG. 11 is a block diagram illustrating an example digital RX circuit suitable for use with the present invention.

A block diagram illustrating an example digital RX circuit suitable for use with the present invention is shown in FIG. 11. The digital RX module, generally referenced 220, comprises an I path including rate change filter 1 222, prefilter 224, digital offset correlator 226, resampler 228 and rate change filter 2 230, a Q path including rate change filter 1 241, prefilter 242, digital offset correlator 244, resampler 246 and rate change filter 2 248, select block 238, feedback control unit 240, I/Q mismatch compensation block 232, zero-IF block 234, I path channel select filter 236 and Q path channel select filter 249.

The digital receive chain shown 220 comprises the necessary anti-aliasing filtering to lower the data rate to the final desired rate of 1.0833 MSps which is 4 times the symbol rate in GSM, for example. In order to provide the lowest jitter clock in the system to the ADC, the input sample rate is directly derived from the LO by an integer division. The LO changes frequency every time-slot when a channel is hopped and results in a variable data rate. The digital baseband, however, preferably expects to see samples at a constant clock rate. The two requirements are simultaneously satisfied by using a digital resampler separating the digital receive chain in to two halves. The digital front-end comprises circuits operating at LO dependent clock rate while the digital back-end comprises circuits that operate at the fixed clock rate after digital resampling.

The digital front-end comprises a first rate change filter (RCF1) 222, 241 that provides anti-aliasing and decimation filtering to reduce the clock rate to $f_{LO}/64N$. It is implemented as a cascade of a sinc polyphase structure that decimates the rate by 16 followed by two half-band finite impulse response (FIR) filters. The design of the first stage is critical in order to have low power dissipation in the digital front-end. This is because the output rate of the ADC is very high and the use of traditional Cascaded Integrator-Comb (CIC) filtering stages create large word-lengths very early in the initial decimation stages. To relieve the design of the high-speed interface between the ADC and RCF1, the ADC output is packed to 8-bit words for transportation across the clock domain interface.

Reduction in area is achieved by interleaving I and Q data and by implementing each phase of the filter as a hard-wired lookup table. The filter provides more than 150 dB of rejection in the 400 kHz band and more than 87 dB of rejection in the 4 MHz band.

Following the RCF1, an 11-tap linear phase FIR filter 224, 242 is used as a prefilter preceding the resampler. Its area is reduced by using sub-structure sharing by employing common sub-expression elimination techniques. The prefilter output is used by the feedback control unit (FCU) 240 to estimate the DC-offset at the mixer output. An inverse value is fed back to a multi-tap direct sampling mixer (MTDSM) using the feedback loop to force the residual DC-offset to zero. Note that the loop gain must be estimated and compensated in order to calculate the feedback value. This is done at the beginning of every packet or burst. The value fed back is kept constant throughout the duration of the packet. Next, the residual DC-offset that could not be corrected by the FCU is corrected by the digital offset corrector (DIGOC) 226, 244 which supports several feed-forward and feedback modes of offset removal. Some of these modes are provided for experimental studies.

The resampler 228, 246 follows the DIGOC and converts the sample rate from $f_{LO}/64N$ to a fixed output rate of 8.66 Msps. The resampler needs to adapt each time slot as the channel is changed. The resampler is implemented as a Farrow structure incorporating a second-order Lagrange polynomial based resampling in the default mode of operation. It supports first-, second-, and third-order Lagrange polynomial resampling.

Following the resampler, the sample rate is further decimated by a second rate change filter (RCF2) 230, 248 to reduce clock rates for subsequent blocks. RCF2 is implemented as a cascade of three decimation-by-2 half-band FIR filters. The output data rate is converted to 4 times the baud rate using linear phase FIR filtering.

An I/Q mismatch compensation block 232 reduces the mismatches between I and Q branches by ensuring that the cross-correlation and the difference between the auto-correlation between I and Q data is close to zero. Any suitable LMS algorithm can be used for adaptation, such as the algorithm described in Elahi et al., "I/Q mismatch compensation in a low-IF receiver in 90 nm CMOS process," IEEE Int. Solid-State Circuits Conf. (ISSCC) Dig. Tech. Papers, February 2005, pp. 542-543, incorporated herein by reference in its entirety.

After mismatch compensation, the IF frequency is then converted from the default low IF of 100 kHz to DC by the zero IF block 234. Since the selection of IF frequency is fully programmable, the zero IF block is also programmable to support the second down-conversion step. The final filtering is performed using a fully programmable 64-tap channel select filter (CSF) 236, 249 that uses a single dedicated MAC unit. It is implemented as a cascade of three 32-tap filter stages. By default, only two stages are used to address the GSM specification. The third stage was provided to support experimental modes of operation.

Figure 12:
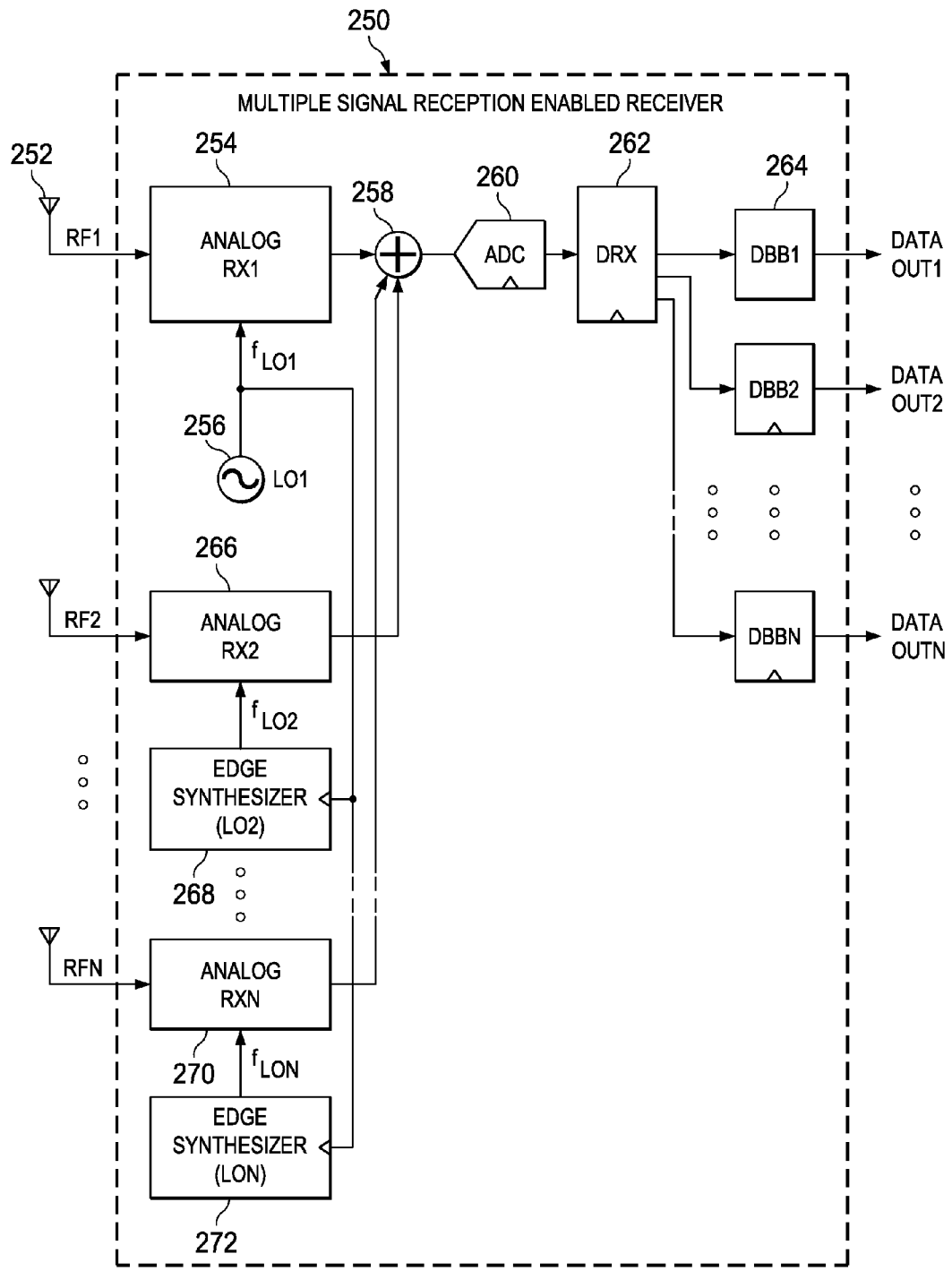
FIG. 12 is a block diagram illustrating a second example receiver capable of simultaneous multiple signal reception constructed in accordance with the present invention.

A block diagram illustrating a second example receiver capable of simultaneous multiple signal reception constructed in accordance with the present invention is shown in FIG. 12. The receiver, generally referenced 250, comprises a plurality of N front end circuits each comprising an analog RX circuit 254 coupled to an antenna 252 and a dedicated oscillator clock source 256, a signal combiner 258, analog to digital converter (ADC) 260, digital RX processing block 262 and N digital baseband (DBB) processing blocks 264.

In operation, each front end circuit is dedicated to reception of a particular wireless signal RF1 through RFN (i.e. which may conform to a known wireless standard) originating from one or more antennas 252. A single local oscillator (LO) 256 generates a local oscillator signal $f_{LO1}$ that is used by the analog RX1 254 circuit to downconvert the RF1 signal from the antenna to a particular intermediate frequency (IF). The clock source signals for analog RX circuits in front end circuits 2 through N are generated by edge synthesizers rather than by dedicated local oscillators as in FIG. 5. Edge synthesizer circuit 268 generates clock source LO2 signal for the analog RX2 circuit 266. Similarly, edge synthesizer circuit 272 generates clock source LON signal for the analog RXN circuit 270.

The IF frequencies (or frequency bands) for each of the RX front end circuits are selected such that when the individual IF signals are combined at combiner 258 they can subsequently be separated after RX and baseband processing. Thus, the individual IF signals output of the RX front end circuits are frequency multiplexed into a single combined IF signal via combiner 258.

The frequency multiplexed combined IF signal is converted to the digital domain by the ADC 260. Digital RX processing 262 performs decimation and filtering on the digitized combined IF signal. The digital baseband blocks 264 detect each individual signal to generate separate data output signals DATA_OUT1 through DATA_OUTN. Note that the digital baseband processing may be implemented entirely in software, hardware or a combination thereof. If implemented in software, the baseband processing tasks performed for each signal can be implemented as a series of serial tasks, parallels tasks or a combination thereof.

An advantage of this second receiver embodiment is that only a single local oscillator circuit is needed to implement a multiple signal reception receiver. The LO circuits of FIG. 5 for RX front end circuits 2 through N have been replaced with edge synthesizer circuits which are capable of generating any frequency. Note that the implementation of the edge synthesizer is not critical to the invention as long the circuit is capable of generating the required clock signals.

In a conventional PLL architecture, a key element is the voltage controlled oscillator (VCO). The VCO output frequency is a function of input voltage, which is proportional to the phase error signal. Therefore, the feedback mechanism can eventually eliminate the phase difference and make the VCO's output frequency/phase lock to the reference. In an ADPLL design, however, the frequency generation mechanism is different due to the fact that the phase error signal is not a voltage of the analog domain but a digital value. The counterpart of the VCO used in such a system is a DCO. The DCO is operative to take a digital value as input and generate a signal whose frequency is related to this input value in a certain way.

Figure 13:
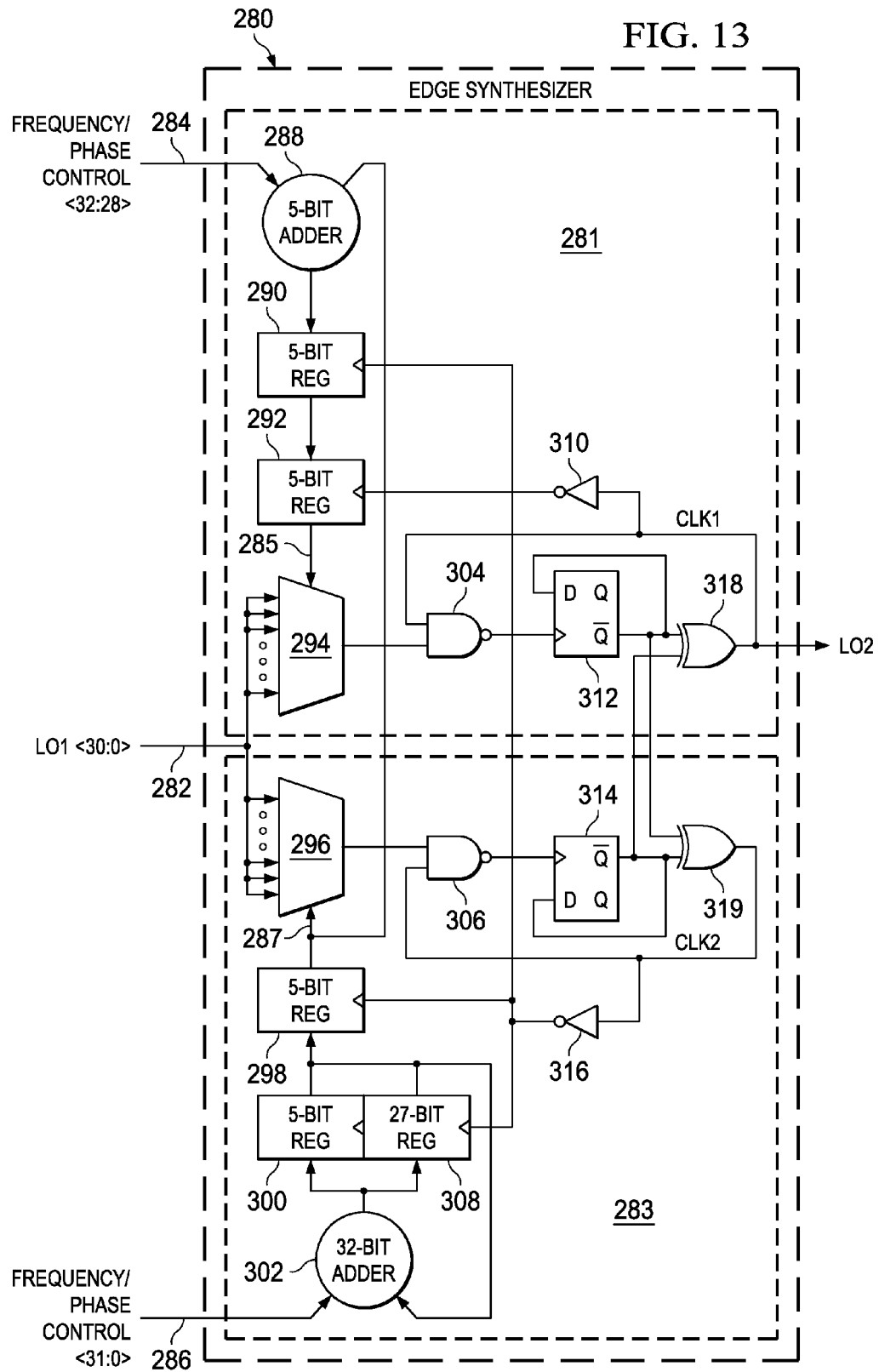
FIG. 13 is a block diagram illustrating an example clock edge synthesizer suitable for use with the present invention.

The basic principle of the edge synthesizer is frequency correction in a feedforward manner, whereby the phase/frequency correction feedback of the VCO/DCO is avoided. The construction of the edge synthesizer in the example presented herein is based on a well-known "flying-adder" frequency and phase synthesis architecture. A block diagram illustrating an example clock edge synthesizer (also referred to as a flying adder synthesizer) suitable for use with the present invention is shown in FIG. 13. The synthesizer, generally referenced 280, comprises 5-bit adder 288, 32-bit adder 302, 5-bit registers 290, 292, 298, 300, 27-bit register 308, multiplexers 294, 296, flip-flops 312, 314, inverters 310, 316, NAND gates 304, 306, XOR gates 318, 319.

The edge synthesizer 280 is operative to generate a clock signal in a pipelined manner, so as to permit higher frequency output clocks nearing the theoretical limit. A single instance of edge synthesizer 280 is described hereinbelow for the example in which a single frequency clock is generated. It is contemplated that those skilled in the art are able to provide phase synthesis capability in combination with frequency synthesis circuit 280 as well as multiple frequency and phase synthesis capability.

In operation, a PLL/VCO, such as LO1 256 (FIG. 12) is used to generate multiple phases (31 in this example) that are utilized by the flying-adder edge synthesizer to generate the desired frequency and phase. In normal operation, the PLL/VCO is running at a fixed frequency. Since no bandwidth requirement is specified for this PLL, the design can be focused on stability and jitter immunity rather than instead of dynamic response. In addition, since the accuracy of the R and C components in this loop is not critical, they can be constructed by using transistors and poly resistors. Due to the unique feature of fixed frequency, one skilled in the art can design this PLL with very low cost in terms of area and design complexity.

In this circuit, the FREQ/PHASE control signal is the 33-bit frequency control word (FCW) where the upper most 5 bits 284 are input to the 5-bit adder 288 while the lower 32 bits are input to the 32-bit adder 302, LO1 is the 31 reference signals from LO1 256 (FIG. 12) and LO2 is the output signal with desired frequency. Note that the generation of signals LO3 through LON is generated using similar edge synthesizer circuits utilizing the LO1 signal.

The principle idea of flying-adder architecture is to use multiple equally spaced phases generated from a VCO to synthesize various frequency and phase by triggering the flip-flops 312. 314 at predetermined times. The circuit 280 comprises two paths of logic cells of flip-flops, NAND, XOR/XNOR, registers and adders. Each path also has one 32-to-1 multiplexer 294, 296 that is used to select the clock from the VCO/DCO of LO1 to trigger the flip-flop. Each path is responsible for generating the rising (or falling) edge of the synthesized output LO2. The two paths are interlocked by the NAND gates 304, 306 so that only one path is active at any given time. The pipeline registers are used to ensure that all the adders have one full cycle time of LO2 to function. The output is also fed back as the timing clock for the registers, to ensure the proper data flow.

In one example embodiment, the internal ring-oscillator based VCO is locked to a 14.31818-MHz crystal by a divider of eight. The VCO has 31 delay stages. Thus, the time difference between any two adjacent phases is 0.282 ns. The relationship between the control word and the output frequency can be expressed as $$FREQ[32:0] = \left(\frac{1}{f*0.282}\right) \quad (1)$$

where f is the desired frequency in megahertz. FREQ[32:0] is the frequency/phase control word, FREQ[32:27] is the integer part and FREQ[26:0] is the fractional part. The fractional part is needed to generate certain "time-average" frequencies that cannot be produced otherwise.

The VCO is an integrator and in the S-domain, its transfer function is H(S)=G/S, where G is the VCO gain, In the Z-domain, the DCO can be modeled by $$H(Z) = \frac{1}{(1-Z^1)} \quad (2)$$

through impulse-invariant Z-transform. The frequency control word is initially set to a value that generates a clock at a desired a specified frequency. Then, based on the actual frequency, a phase error signal is generated. This error signal is converted to an incremental change to the current frequency control word that adjusts the clock's frequency.

Unlike an analog VCO that requires certain number of cycles to lock to new frequency when the control signal is changed, the flying-adder synthesizer of FIG. 13 can adjust its output to a new frequency in the next cycle. This architecture is thus a good frequency source for use in a receiver or transceiver. Consequently, the circuit responds instantly with input change.

Note that theoretically, any frequency within a certain range can be generated by the flying-adder architecture. In practice, however, the frequency resolution is related to the number of fractional bits. In this example embodiment, application, there are 27-bits reserved for the fractional part, which is more than sufficient for generating all the frequencies required by the receiver. The edge synthesizer is also of generating a different phase (i.e. delay) version of the clock, which could be useful in the receiving circuits.

As shown in FIG. 13, edge synthesis circuit 280 comprises two paths 283, 281 for generating the leading and trailing edges of the LO2 output clock signal, respectively. Each of paths comprises a respective 32-to-1 multiplexer 296, 294 for selecting one of the 32 clock phases provided by LO1 256 (FIG. 12) in response to select values presented on lines 287, 285, respectively. Since edge synthesizer circuit 280 effectively comprises two interlocked 32-to-1 multiplexers 287, 285, a total of 64 potential phases are available for use in the generation of the LO2 output clock signal. Thus, six integer bits are required to select among these potential edge synthesizer 280 receives 33 digital FREQ/PHASE control lines; the most significant five bits FREQ[32:28] are input to adder 288 in path 281 for use in the generation of the trailing edge of the output clock signal, while the least significant 32 bits FREQ[31:0] are input to adder 302 in path 283.

The outputs of multiplexers 296, 294 are respectively applied to one input of a corresponding NAND gate 306, 304. The outputs of NAND gates 306, 304 are applied to the clock inputs of D-flip-flops 314, 312, respectively. Each of flip-flops 314, 312 are connected in toggle fashion, with their inverting outputs applied to their D inputs. The outputs of flip-flop 314, 312 are each applied to the inputs of XOR gate 319 and XNOR gate 318. Additionally, signal CLK2 is connected to a second input of NAND gate 306 and to a clock input of registers 290, 298, 308 via inverter 316. Signal CLK1 is connected to a second input of NAND gate 304 and to clock inputs of accumulator register 292 via inverter 310.

In path 283, multiplexer 296 is controlled by lines 287 generated by register 298. Similarly, in path 281, multiplexer 294 is controlled by lines 285 generated by register 292. Note that the output of the adders 288, 302 are pipelined such that accumulator adder 302 is performing the appropriate operations to generate its next value during such time as the trailing edge of the LO2 output clock signal is being generated by path 281. Thus, adder 288 generates its next value for lines 285 during such time as the leading edge of the clock signal on LO2 is propagating through path 283. Additionally, synchronization of paths 283, 281 with one another is accomplished communicating line 287 from adder 302 to adder 288.

Additional details describing the operation of the clock edge synthesizer can be found in U.S. Pat. No. 6,329,850, to Mair et al., entitled "Precision frequency and phase synthesis," and in U.S. Pat. No. 7,356,107, to Xiu et al., entitled "Flying-adder frequency synthesizer-based digital-controlled oscillator and video decoder including the same," both of which are incorporated herein by reference in their entirety.

ADPLL Circuit and Polar Transmitter Based Thereon

Figure 14:
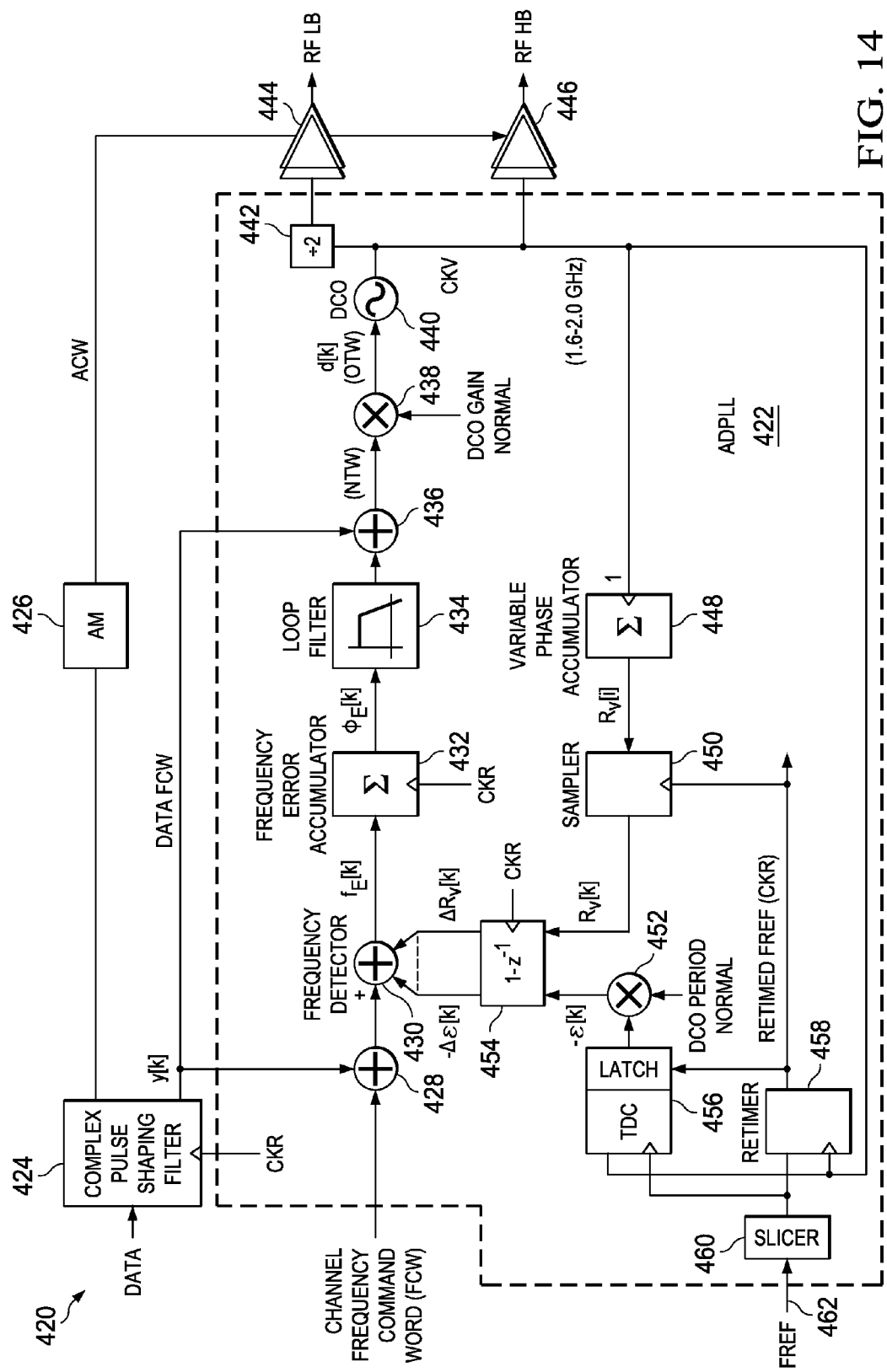
FIG. 14 is a block diagram illustrating an example ADPLL suitable for use in the local oscillator and transceiver circuits of the present invention.

A block diagram illustrating an example ADPLL suitable for use in the local oscillator and transceiver circuits of the present invention is shown in FIG. 14. The ADPLL presented herein is provided as an example of an analog-intensive PLL replacement circuit suitable for use as the local oscillator in the multiple signal reception receiver and transceiver embodiments of the invention described herein.

A more detailed description of the operation of the ADPLL can be found in U.S. Patent Publication No. 2006/0033582A1, published Feb. 16, 2006, to Staszewski et al., entitled "Gain Calibration of a Digital Controlled Oscillator," U.S. Patent Publication No. 2006/0038710A1, published Feb. 23, 2006, to Staszewski et al., entitled "Hybrid Polar/Cartesian Digital Modulator" and U.S. Pat. No. 6,809,598, to Staszewski et al., entitled "Hybrid Of Predictive And Closed-Loop Phase-Domain Digital PLL Architecture," all of which are incorporated herein by reference in their entirety.

For illustration purposes only, the transmitter, as shown, is adapted for the GSM/EDGE cellular standards. It is appreciated, however, that one skilled in the communication arts can adapt the transmitter illustrated herein to other modulations and communication standards as well without departing from the spirit and scope of the present invention.

The transmitter, generally referenced 420, is well-suited for a deep-submicron CMOS implementation. The transmitter comprises a complex pulse shaping filter 424, amplitude modulation (AM) block 426 and ADPLL 422. The circuit 420 is operative to perform complex modulation in the polar domain in addition to the generation of the local oscillator (LO) signal for the RX front end circuits and edge synthesizers. All clocks in the system are derived directly from this source. Note that the transmitter is constructed using digital techniques that exploit the high speed and high density of the advanced CMOS, while avoiding problems related to voltage headroom found in such process. The ADPLL circuit replaces a conventional RF synthesizer architecture (based on a voltage-controlled oscillator (VCO) and a phase/frequency detector and charge-pump combination), with a digitally controlled oscillator (DCO) 440 and a time-to-digital converter (TDC) 456. All inputs and outputs are digital and some even at multi-GHz frequency.

The core of the ADPLL is a digitally controlled oscillator (DCO) 440 adapted to generate the RF oscillator clock CKV. The oscillator core (not shown) operates at a multiple of the 1.6-2.0 GHz (e.g., 4) high band frequency or at a multiple of the 0.8-1.0 GHz low band frequency (e.g., 8). Note that typically, the multiple is a power-of-two but any other suitable integer or even fractional frequency relationship may be advantageous. The output of the DCO is then divided for precise generation of RX quadrature signals, and for use as the transmitter's carrier frequency. The single DCO is shared between transmitter and receiver and is used for both the high frequency bands (HB) and the low frequency bands (LB). In addition to the integer control of the DCO, at least 3-bits of the minimal varactor size used are dedicated for ΣΔ dithering in order to improve frequency resolution. The DCO comprises a plurality of varactor banks, which may be realized as n-poly/n-well inversion type MOS capacitor (MOSCAP) devices or Metal Insulator Metal (MIM) devices that operate in the flat regions of their C-V curves to assist digital control. The output of the DCO is a modulated digital signal at $f_{RF}$. This signal is input to the high band (HB) pre-power amplifier (PPA) 446. It is also input to the RF low band (LB) pre-power amplifier 444 after divide by two via divider 442.

The expected variable frequency $f_V$ is related to the reference frequency $f_R$ by the frequency command word (FCW).

$$FCW[k] \equiv \frac{E(f_V[k])}{f_R} \quad (3)$$

The FCW is time variant and is allowed to change with every cycle $T_R=1/f_R$ of the frequency reference clock. With $W_F=24$ the word length of the fractional part of FCW, the ADPLL provides fine frequency control with 1.5 Hz accuracy, according to:

$$\Delta f_{res} = \frac{f_R}{2^{W_F}} \quad (4)$$

The number of integer bits $W_I=8$ has been chosen to fully cover the GSM/EDGE and partial WCDMA band frequency range of $f_V=1,600-2,000$ MHz with an arbitrary reference frequency $f_R \geq 8$ MHz.

The ADPLL operates in a digitally-synchronous fixed-point phase domain as follows: The variable phase accumulator 448 determines the variable phase $R_V[i]$ by counting the number of rising clock transitions of the DCO oscillator clock CKV as expressed below.

$$R_V[i] = \sum_{i=0}^{i} 1 \quad (5)$$

The index i indicates the DCO edge activity. The variable phase $R_V[i]$ is sampled via sampler 450 to yield sampled FREF variable phase $R_V[k]$, where k is the index of the FREF edge activity. The sampled FREF variable phase $R_V[k]$ is fixed-point concatenated with the normalized time-to-digital converter (TDC) 456 output $\epsilon[k]$. The TDC measures and quantizes the time differences between the frequency reference FREF and the DCO clock edges. The sampled differentiated (via block 454) variable phase is subtracted from the frequency command word (FCW) by the digital frequency detector 430. The frequency error $f_E[k]$ samples $$f_E[k]=FCW-[(R_V[k]-\epsilon[k])-(R_V[k-1]-\epsilon[k-1])] \quad (6)$$

are accumulated via the frequency error accumulator 432 to create the phase error $\phi_E[k]$ samples $$\phi_E[k] = \sum_{l=0}^{k} f_E[k] \quad (7)$$

which are then filtered by a fourth order IIR loop filter 434 and scaled by a proportional loop attenuator α. A parallel feed with coefficient ρ adds an integrated term to create type-II loop characteristics which suppress the DCO flicker noise.

The IIR filter is a cascade of four single stage filters, each satisfying the following equation:

$$Y[k]=(1-\lambda)\cdot y[k-1]+\lambda\cdot x[k] \quad (8)$$

wherein
  x[k] is the current input;
  y[k] is the current output;
  k is the time index;
  λ is the configurable coefficient;

The 4-pole IIR loop filter attenuates the reference and TDC quantization noise with an 80 dB/dec slope, primarily to meet the GSM/EDGE spectral mask requirements at 400 kHz offset. The filtered and scaled phase error samples are then multiplied by the DCO gain $K_{DCO}$ normalization factor $f_R/\hat{K}_{DCO}$ via multiplier 438, where $f_R$ is the reference frequency and $\hat{K}_{DCO}$ is the DCO gain estimate, to make the loop characteristics and modulation independent from $K_{DCO}$. The modulating data is injected into two points of the ADPLL for direct frequency modulation, via adders 428 and 436. A hitless gear-shifting mechanism for the dynamic loop bandwidth control serves to reduce the settling time. It changes the loop attenuator a several times during the frequency locking while adding the $(\alpha_1/\alpha_2-1)\phi_1$ dc offset to the phase error, where indices 1 and 2 denote before and after the event, respectively. Note that $\phi_1=\phi_2$, since the phase is to be continuous.

The frequency reference FREF is input to the retimer 458 and provides the clock for the TDC 456. The FREF input is resampled by the RF oscillator clock CKV via retimer block 458 which may comprise a flip flop or register clocked by the reference frequency FREF. The resulting retimed clock (CKR) is distributed and used throughout the system. This ensures that the massive digital logic is clocked after the quiet interval of the phase error detection by the TDC. Note that in the example embodiment described herein, the ADPLL is a discrete-time sampled system implemented with all digital components connected with all digital signals.

Figure 15:
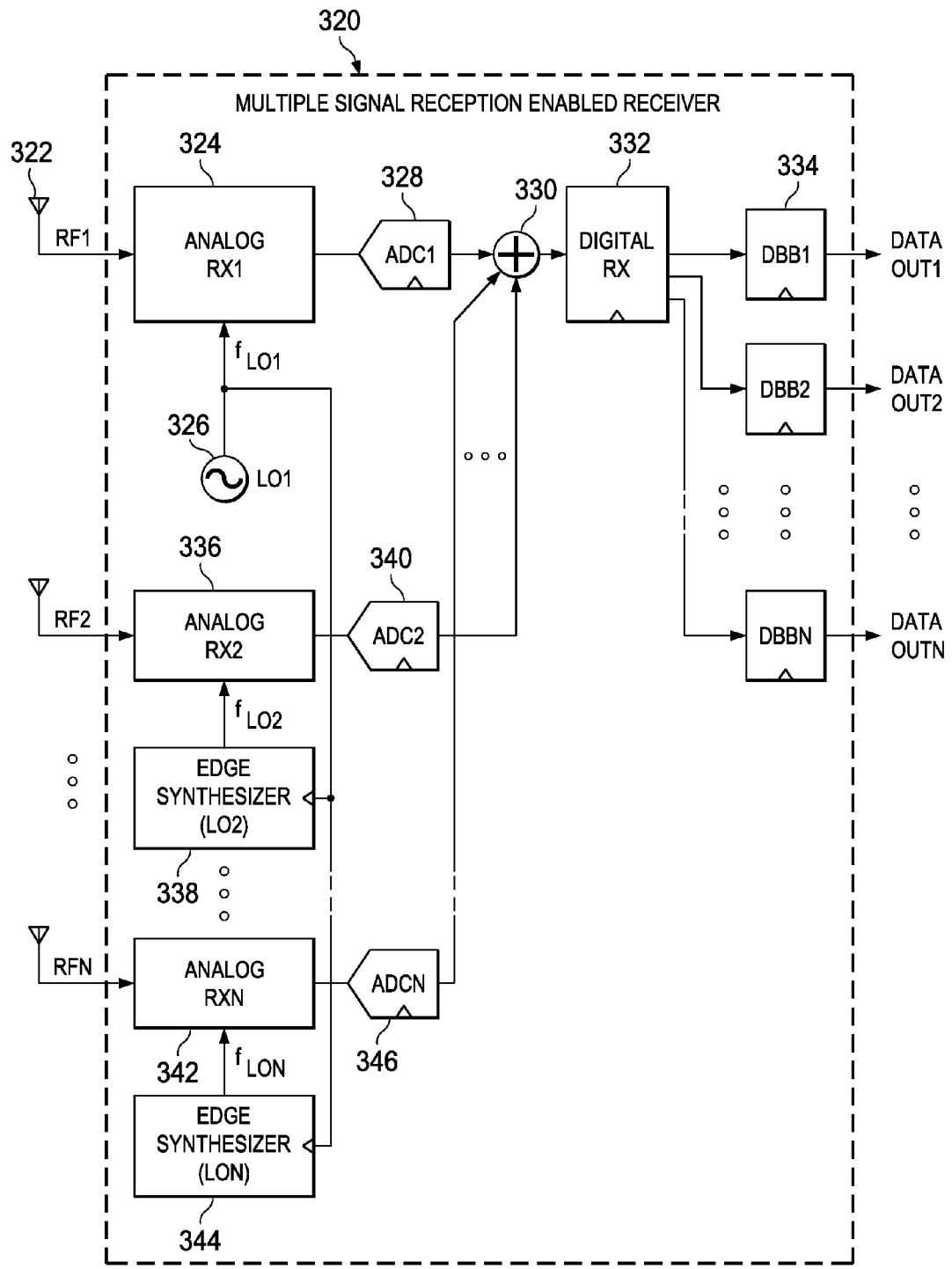
FIG. 15 is a block diagram illustrating a third example receiver capable of simultaneous multiple signal reception constructed in accordance with the present invention.

A block diagram illustrating a third example receiver capable of simultaneous multiple signal reception constructed in accordance with the present invention is shown in FIG. 15. The receiver, generally referenced 320, comprises a plurality N of front end circuits each comprising an analog RX circuit 324 coupled to an antenna 322, a dedicated oscillator clock source 326 and an analog to digital converter (ADC) 328, a digital signal combiner 330, digital RX processing block 322 and N digital baseband (DBB) processing blocks 334.

In operation, each front end circuit is dedicated to reception of a particular wireless signal RF1 through RFN (i.e. which may conform to a known wireless standard). A single local oscillator (LO1) 326 generates a local oscillator signal $f_{LO1}$ that is used by the analog RX1 324 circuit to downconvert the RF1 signal from the antenna to a particular intermediate frequency (IF). The analog IF signal is converted to the digital domain via ADC1 328.

For RX front end circuits 2 through N, however, the clock signal source for the analog RX circuit is provided by an edge synthesizer. In particular, local oscillator signal $f_{LO2}$ is generated by edge synthesizer 338 and input to analog RX2 circuit 336. Analog RX2 circuit 336 downconverts the RF2 signal from the antenna to a particular intermediate frequency (IF). This analog IF signal is converted to the digital domain via ADC2 340. For RX front end circuit N, local oscillator signal $f_{LON}$ is generated by edge synthesizer 344 and input to analog RXN circuit 342. Analog RXN circuit 342 downconverts the RFN signal from the antenna to a particular intermediate frequency (IF). This analog IF signal is converted to the digital domain via ADCN 346.

The IF frequencies (or frequency bands) for each of the RX front end circuits are selected such that when the individual digital IF signals are combined at combiner 330 they can subsequently be separated after RX and baseband processing. Thus, the individual IF signals output of the RX front end circuits are frequency multiplexed into a single digital combined IF signal via combiner 330. Note that the combiner may require the use of interpolation if the data sample rates of ADC1, ADC2, . . . ADCN are not compatible to achieve easy combination. Alternatively, the combiner can exploit any other suitable multiple access technique, such as CDMA or OFDMA. In this alternative case, the ADC1 . . . ADCN generates digital outputs encoded in CDMA or OFDM multiple access format.

Digital RX processing 332 performs decimation and filtering on the digitized combined IF signal. The digital baseband blocks 334 demodulate each individual signal to generate separate data output signals DATA_OUT1 through DATA_OUTN. Note that the digital baseband processing may be implemented entirely in software, hardware or a combination thereof. If implemented in software, the baseband processing tasks performed for each signal can be implemented as a series of serial tasks, parallels tasks or a combination thereof.

Figure 16:
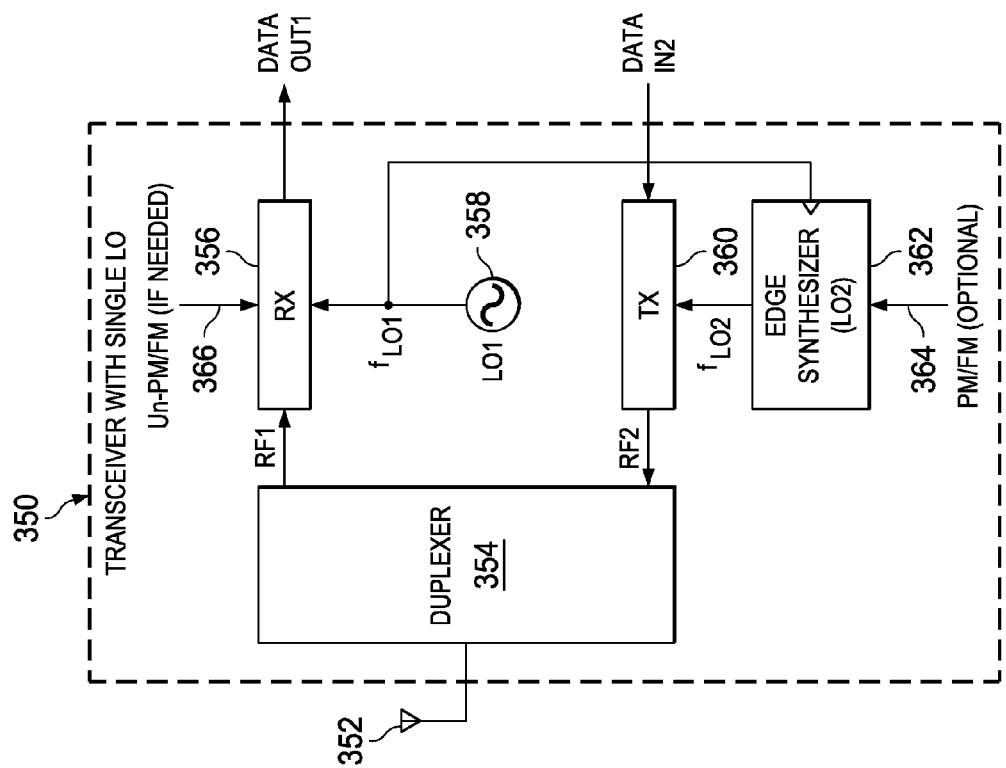
FIG. 16 is a block diagram illustrating a fourth example transceiver using a single local oscillator constructed in accordance with the present invention.

A block diagram illustrating a fourth example transceiver using a single local oscillator constructed in accordance with the present invention is shown in FIG. 16. The transceiver, generally referenced 350, operates at full duplex and comprises a duplexer 354 coupled to antenna 352, RX circuit 356, a local oscillator (LO1) 358, TX circuit 360 and edge synthesizer 362.

In this transceiver embodiment, the single local oscillator (LO1) is operative to provide the $f_{LO1}$ signal for use by the receiver 356. The receiver processes the RF1 signal received from the antenna via the duplexer 354. The LO1 signal is used to clock the edge synthesizer circuit 362 operative to generate the clock source (i.e. "local oscillator") signal $f_{LO2}$ for the transmitter 360. The receiver circuit downconverts the signal, decimates, filters, demodulates and decodes the signal to generate the DATA_OUT1 signal. Note that optionally, the receiver comprises circuitry to remove any phase/frequency modulation 366 that may have been added to the clock signal. Note also that the transceiver may comprise additional receiver front end circuits, each using an edge synthesizer to generate a respective local oscillator signal based on the LO1 signal.

The transmitter generates the RF2 signal in accordance with the DATA_IN2 signal. The RF2 transmit signal is coupled to the antenna 352 via the duplexer 354. Any optional phase/frequency modulation 364 (e.g., as part of a polar transmitter) is performed by the edge synthesizer 362. The edge synthesizer may comprise a conventional fractional-N divider well known in the arts or may be constructed in accordance with the example edge synthesizer circuit of FIG. 13. Note that the transceiver may comprise additional transmitter circuits, each using an edge synthesizer to generate a respective local oscillator signal based on the LO1 signal.

Figure 17:
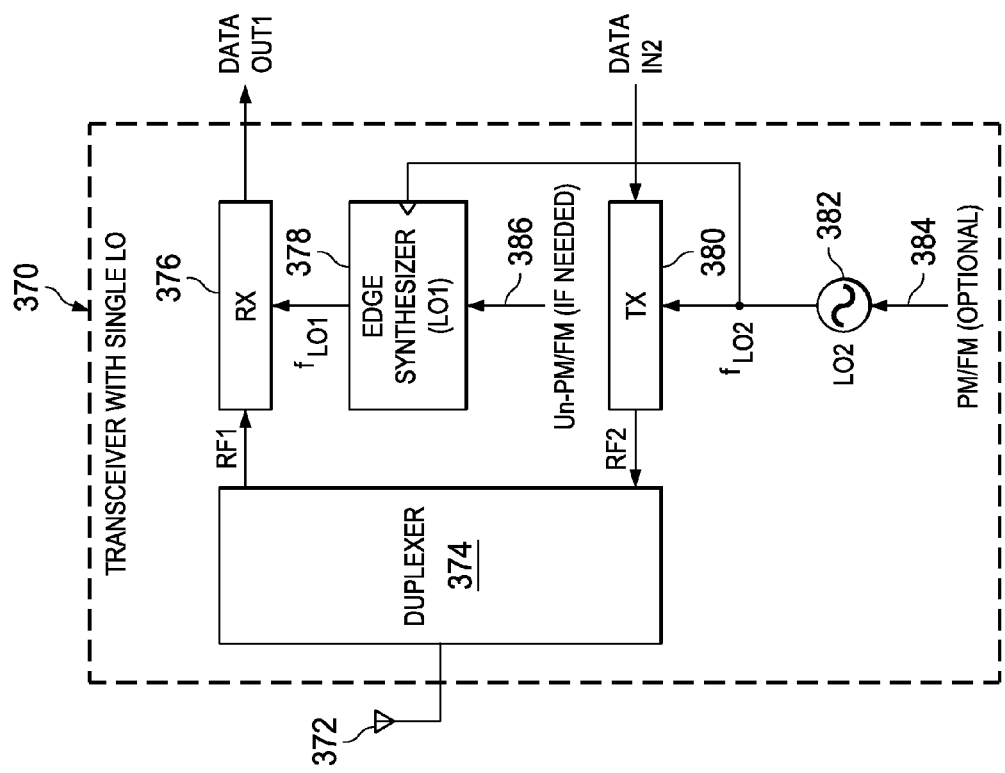
FIG. 17 is a block diagram illustrating a fifth example transceiver using a single local oscillator constructed in accordance with the present invention.

A block diagram illustrating a fifth example transceiver using a single local oscillator constructed in accordance with the present invention is shown in FIG. 17. The transceiver, generally referenced 370, operates at full duplex and comprises a duplexer 374 coupled to antenna 372, RX circuit 376, edge synthesizer (LO1) 378, TX circuit 380 and local oscillator (LO2) 382.

In this transceiver embodiment, the single local oscillator (LO2) is operative to provide the $f_{LO2}$ signal for use by the transmitter 380. In this example presented herein, the transmitter comprises a polar transmitter. Thus, the $f_{LO2}$ signal is phase/frequency modulated 384 for use by the transmitter as the 'angle' or phase portion of the transmit signal. This signal is then amplitude modulated to provide the amplitude portion of the transmit signal.

The transmitter generates the RF2 signal in accordance with the DATA_IN2 signal. The RF2 transmit signal is coupled to the antenna 372 via the duplexer 374. Phase/frequency modulation is performed by the local oscillator 382. The local oscillator may be constructed in accordance with the ADPLL circuit of FIG. 14 described supra. Note that the transceiver may comprise additional transmitter circuits, each using an edge synthesizer to generate a respective local oscillator signal based on the LO2 signal.

The receiver processes the RF1 signal received from the antenna via the duplexer 374. The LO2 signal used to clock the edge synthesizer circuit 378 operative to generate the clock source (i.e. "local oscillator") signal of frequency $f_{LO1}$ for the receiver. The phase/frequency modulation applied to LO2 signal for use by the polar transmitter, must first be removed 386 before it can be used by the receiver. The receiver circuit downconverts the RF1 signal, decimates, filters, demodulates and decodes the signal to generate the DATA_OUT1 signal. Note also that the transceiver may comprise additional receiver front end circuits, each using an edge synthesizer to generate a respective local oscillator signal based on the LO2 signal.

The use of DRP techniques (e.g., the ADPLL of FIG. 14) in the transmit path directly modulates phase/frequency of the ADPLL-based frequency synthesizer, which acts as a local oscillator, with no follow-up frequency upconversion or I/Q modulation. The use of DRP technology in the receiver front-end 356 (FIG. 16), 376 (FIG. 17) is based on the use of a multi-tap direct sampling mixer (MTDSM) which operates based on a switched-cap principle at RF frequencies. If the same LO as used in the transmitter is used in the MTDSM in the receiver, then (1) the transmit band cannot be separated from the receive band and (2) the demodulated signal will have the transmitted component.

Both problems are overcome by frequency shift (translation) and/or un-modulating (i.e. removing) the TX modulation in the MTDSM mixer through a two-dimensional transversal of the rotating capacitors. Normally, the rotating capacitors of the MTDSM are physically assigned to one history capacitor. They take turns in one-dimension by rotating amongst themselves in determining which capacitor is connected to the history capacitor. In the MTDSM used in the present invention, a second dimension is such that the rotating capacitors are free to connect to any of the four history capacitors associated with each quadrature phase (i.e. I+, Q+, I−, Q−).

If, for example, the active rotating capacitors of the four quadrature phases shift by one history capacitor with each LO cycle, then the received RF frequency is shifted up or down (depending on the shift direction) by one-fourth. For a precise frequency offset, a dithered selection is proposed (such as through sigma-delta digital modulation). Note that in order to preserve the quadrature signalling, all four active rotating capacitors need to switch in tandem.

Figure 18:
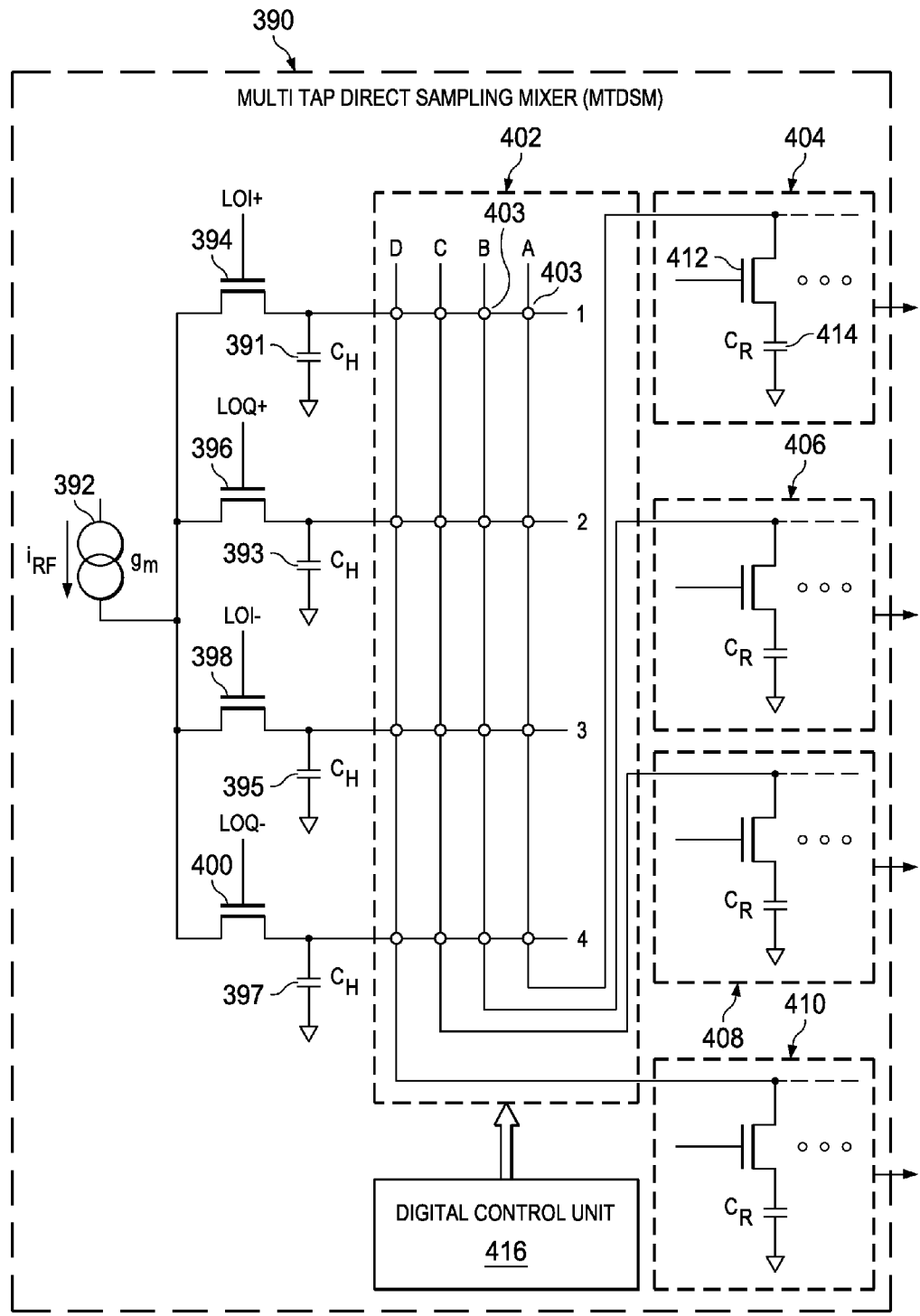
FIG. 18 is a block diagram illustrating an example multi-tap direct sampling mixer (MTDSM) suitable for use with the present invention.

A block diagram illustrating an example multi-tap direct sampling mixer (MTDSM) suitable for use with the present invention is shown in FIG. 18. The MTDSM circuit, generally referenced 390, comprises I+, Q+, I−, Q−, LO transistors 394, 396, 398, 400 and history capacitors $C_H$ 391, 393, 395, 397, respectively, switch matrix 402 comprising a plurality of switches 403 and rotating capacitor blocks 404, 406, 408, 410, each comprising a transistor 412 and rotating capacitor $C_R$ 414.

The example I/Q top-level MTDSM architecture of the invention arranged for performing complex filtering by allowing the sharing of charge samples across the paths I+, I−, Q+, Q−. For example, the Q− rotating capacitor $C_R$ may be connected to the I+ history capacitor $C_H$. This arrangement provides the capability of effectively changing the sampling frequency. The interconnections between the history capacitors and rotating capacitors are determined by a switching matrix $\{(A, B, C, D) \times (1, 2, 3, 4)\}$ that is controlled by a digital control unit (DCU) 416.

The operation of the complex filter can be seen with further reference to Table 1 below. The baseline of the real-valued filtering is maintained when switches A1, B2, C3, D4 are 'on' and all others are 'off'. If the pairing between $C_H$ and $C_R$ is skewed, for example, for the switch matrix configuration A2, B3, C4, D1, the MTDSM still performs real-valued filtering, but the phase of the demodulated signal is offset by $\pi/2$. In practical wireless communications applications, however, the absolute phase is not measurable so the two example static configurations discussed above would be indistinguishable. Due to the spatial separation of the receiver and transmitter, only the relative phase changes would be measurable. All four configurations of the switch matrix are summarized in Table 1 below.

TABLE 1

Switch matrix configurations

| | | | | |
|---|---|---|---|---|
| Configuration 1 | A1 | B2 | C3 | D4 |
| Configuration 2 | A2 | B3 | C4 | D1 |
| Configuration 3 | A3 | B4 | C1 | D2 |
| Configuration 4 | A4 | B1 | C2 | D3 |

Complex filtering is realized by rotating through the matrix in the sequence shown by the rows of Table 1. For example, beginning with a first arbitrary instant of time, the switches A1, B2, C3, D4 are in the 'on' state; at the next instant, switches A2, B3, C4, and D1 are 'on'; and so on. By rotating through the rows, a band-pass transfer function is defined with a center frequency determined by the rotation speed, i.e. inverse of RF or LO cycles per rotation step. Selection between positive and negative frequency offsets may be accomplished by selecting the direction of rotation. It is appreciated that the switch matrix is not required to be physically separated from the rotating capacitor $C_R$ and history capacitor $C_H$ array structure. The switches may be merged with the rotating capacitor $C_R$-coupled switches. The baseline of the real-valued filtering may also be high-pass instead of band-pass as in the above example.

A more detailed description of the operation of the MTDSM circuit can be found in U.S. Publication No. 2005/0233725, to Muhammad et al., entitled "Image reject filtering in a direct sampling mixer," incorporated herein by reference in its entirety.

It is important to note that in the transceiver circuits of FIGS. 16 and 17, the transmit and receive frequency band separation can be software programmed by simply reprogramming the digital control unit (DCU) 416 controlling the MTDSM. This facilitates quick and easy adaptation of the transceiver to different wireless standards.

Figure 19:
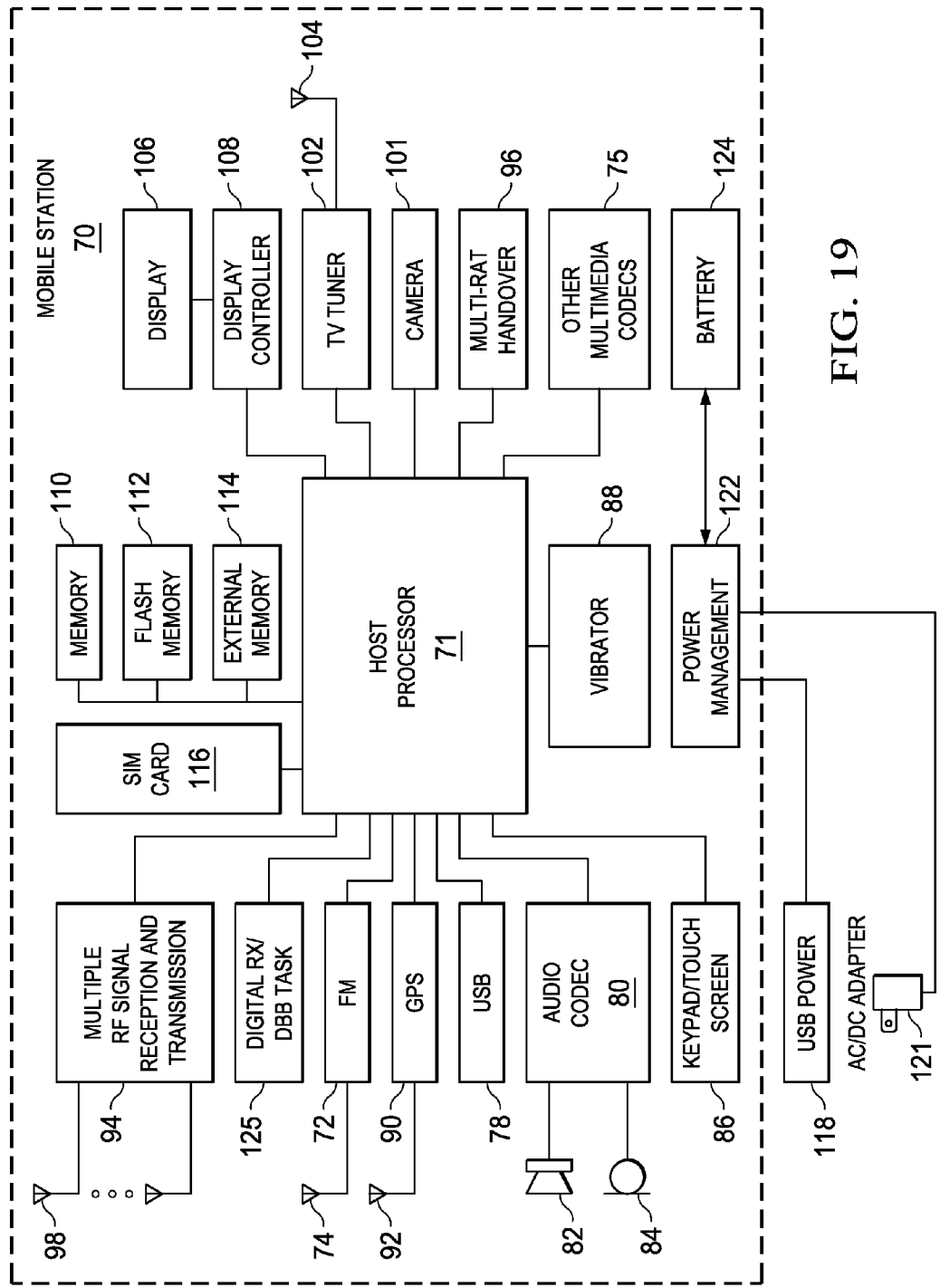
FIG. 19 is a block diagram illustrating an example mobile communication device incorporating the simultaneous multiple signal reception and transmission mechanism of the present invention.

Mobile Device Incorporating the Simultaneous Multiple Signal Reception and Transmission Mechanism A simplified block diagram illustrating an example mobile communication device incorporating the simultaneous multiple signal reception and transmission mechanism of the present invention is shown in FIG. 19. Note that the mobile device may comprise any suitable wired or wireless device such as multimedia player, mobile communication device, cellular phone, smartphone, iPhone, Google phone, PDA, Bluetooth device, etc. For illustration purposes only, the device is shown as a mobile device, such as a cellular phone. Note that this example is not intended to limit the scope of the invention as the power efficiency improvement mechanism of the present invention can be implemented in a wide variety of communication devices.

The mobile device, generally referenced 70, comprises a baseband processor or CPU 71 having analog and digital portions. The mobile device comprises a plurality of RF transceivers 94 and associated antennas 98. RF transceivers for the basic cellular link and any number of other wireless standards and Radio Access Technologies (RATs) may be included. Examples include, but are not limited to, Global System for Mobile Communication (GSM)/GPRS/EDGE 3G; CDMA; UMB, WiMAX for providing WiMAX wireless connectivity when within the range of a WiMAX wireless network; Bluetooth for providing Bluetooth wireless connectivity when within the range of a Bluetooth wireless network; WLAN for providing wireless connectivity when in a hot spot or within the range of an ad hoc, infrastructure or mesh based wireless LAN network; near field communications; UWB; FM, GPS, etc. One or more of the RF transceivers may comprise additional antennas to provide antenna diversity which yields improved radio performance.

The mobile device may also comprise internal RAM and ROM memory 110, Flash memory 112 and external memory 114. Several user-interface devices include microphone(s) 84, speaker(s) 82 and associated audio codec 80 or other multimedia codecs 75, a keypad 86 (or touch-screen controller) for entering dialing digits and for other controls and inputs, vibrator 88 for alerting a user, camera and related circuitry 101, a TV tuner 102 and associated antenna 104, display(s) 106 and associated display controller 108 and GPS receiver 90 and associated antenna 92. A USB or other interface connection 78 (e.g., SPI, SDIO, PCI, etc.) provides a serial link to a user's PC or other device. An FM transceiver 72 and antenna 74 provide the user the ability to listen to FM broadcasts as well as the ability to transmit audio over an unused FM station at low power, such as for playback over a car or home stereo system having an FM receiver. SIM card 116 provides the interface to a user's SIM card for storing user data such as address book entries, user identification, etc.

The RF transceivers 94 are operative to implement the simultaneous multiple RF signal reception and transmission mechanism of the present invention. The host processor 71 may be operative to implement the digital processing portion of the mechanism. In particular, a digital RX/DBB software/firmware task 125 is adapted to be executed on the host processor 71. The digital RX/DBB task block 125 is adapted to implement the simultaneous multiple signal reception and transmission mechanism of the present invention as described in more detail supra. In operation, the simultaneous multiple signal reception and transmission mechanism may be implemented as hardware, software or as a combination of hardware and software. Implemented as a software task, the program code operative to implement the power efficiency improvement mechanism of the present invention can be stored in one or more memories 110, 112 or 114 or local memories within the baseband processor.

Portable power is provided by the battery 124 coupled to power management circuitry 122. External power may be provided via USB power 118 or an AC/DC adapter 121 connected to the battery management circuitry 122, which is operative to manage the charging and discharging of the battery 124.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method of multiple signal reception for use in a receiver (RX) having a plurality of RX front end modules, said method comprising the steps of:
   combining outputs of said plurality of RX front end modules utilizing frequency division multiplexing to generate a combined intermediate frequency (IF) signal therefrom; processing said combined IF signal using at least one RX back end module to generate a plurality of data output signals thereby; and
   wherein the number of RX back end modules is less than the number of front end modules.

2. The method according to claim 1, wherein each RX front end module utilizes a dedicated local oscillator.

3. The method according to claim 1, wherein one or more said RX front end modules utilizes an edge synthesizer coupled to a single shared local oscillator.

4. The method according to claim 1, wherein one or more said RX front end modules are coupled to a single shared local oscillator, each of said RX front end modules operative to perform an additional frequency translation.

5. The method according to claim 4, wherein said additional frequency translation is performed by a two-dimensional transversal of rotating capacitors.

6. The method according to claim 1, wherein each said RX front end module comprises a dedicated analog to digital converter and wherein the bandwidth of said at least one RX back-end module is at least that of said combined IF signal.

7. The method according to claim 1, wherein said plurality of RX front end modules share a single analog to digital converter whose bandwidth is at least that of said combined IF signal.

8. The method according to claim 1, wherein each RF front end module is operative to receive a signal of a different wireless standard.

9. The method according to claim 1, wherein at least one RX front end module is dedicated to receiving signals for linearization of transmitter components.

10. The method according to claim 1, wherein at least one RX front end module is dedicated to receiving one or more auxiliary signals.

11. The method according to claim 1, wherein said frequency multiplexed signals are separated by a sufficient buffer band to permit subsequent separation using digital filtering.

12. The method according to claim 1, wherein each RX front end module downconverts an input radio frequency (RF) signal to a different intermediate frequency (IF) to generate said frequency division multiplexed combined IF signal.

13. The method according to claim 1, said step of processing comprises the step of frequency demultiplexing said combined IF signal to generate said plurality of data output signals.

14. An apparatus for multiple signal reception, comprising:
  a plurality of receiver (RX) front end circuits, each RX front end circuit operative to generate an intermediate frequency (IF) signal at a particular frequency band;
  a signal combiner operative to combine said plurality of IF signals using frequency division multiplexing to generate a combined IF signal thereby;
  at least one RX processing path operative to process said combined IF signal to generate a plurality of data output signals thereby; and
  wherein the number of RX processing paths is less than the number of front end circuits.

15. The apparatus according to claim 14, wherein each RX front end circuit is operative to receive a different wireless standard signal.

16. The apparatus according to claim 14, wherein each RX front end circuit comprises a dedicated local oscillator.

17. The apparatus according to claim 14, wherein one or more RF front end circuits comprise an edge synthesizer coupled to a single shared local oscillator.

18. The apparatus according to claim 17, wherein said edge synthesizer is operative to generate output clock edges synchronous to its input.

19. The apparatus according to claim 14, wherein each said RX front end circuit comprises a dedicated analog to digital converter and wherein the bandwidth of said RX processing path is at least that of said combined IF signal.

20. The apparatus according to claim 14, wherein said plurality of RX front end circuits share a single analog to digital converter whose bandwidth is at least that of said combined IF signal.

21. The apparatus according to claim 14, wherein said frequency multiplexed signals are separated by a sufficient buffer band to permit subsequent separation using digital filtering.

22. A single chip radio apparatus, comprising:
  at least one transmitter;
  a plurality of RF front end receive (RX) circuits, each RX circuit operative to receive at least one wireless signal and to generate an intermediate frequency (IF) signal at a particular IF frequency band therefrom;
  a signal combiner coupled to said plurality of RF front end RX circuits, said signal combiner operative to combine the outputs of said plurality of RF front end RX circuits utilizing frequency division multiplexing to generate an analog combined IF signal therefrom;
  a single shared analog to digital converter operative to convert said analog combined IF signal into a digital combined IF signal therefrom; and
  a receive processing path operative to filter and demodulate said digital combined IF signal and to generate a plurality of data output signals in response thereto.

23. The apparatus according to claim 22, wherein said receive processing path comprises a plurality of digital baseband processing paths.

24. The apparatus according to claim 22, wherein each RF front end RX circuit utilizes a dedicated local oscillator.

25. The apparatus according to claim 22, wherein one or more of said RF front end RX circuits utilizes an edge synthesizer coupled to a single shared local oscillator.

26. The apparatus according to claim 22, wherein at least one RF front end RX circuit is dedicated to receiving signals for linearization of transmitter components.

27. The apparatus according to claim 22, wherein at least one RF front end RX circuit is dedicated to receiving one or more auxiliary signals.

28. A single chip radio apparatus, comprising:
  at least one transmitter;
  a plurality of RF front end receive (RX) circuits, each RX circuit comprising a dedicated analog to digital converter and operative to generate a digitized intermediate frequency (IF) signal at a particular IF frequency band;
  a signal combiner coupled to said plurality of RF front end RX circuits, said signal combiner operative to combine said digitized IF signals to generate a multiplexed IF signal therefrom; and
  a single receive processing path operative to filter and demodulate said multiplexed IF signal and to generate a plurality of data output signals in response thereto.

29. The apparatus according to claim 28, wherein said receive processing path comprises a plurality of digital baseband processing paths.

30. The apparatus according to claim 28, wherein each RF front end RX circuit utilizes a dedicated local oscillator.

31. The apparatus according to claim 28, wherein one or more of said RF front end RX circuits utilizes an edge synthesizer coupled to a single shared local oscillator.

32. The apparatus according to claim 28, wherein at least one RF front end RX circuit is dedicated to receiving signals for linearization of transmitter components.

33. The apparatus according to claim 28, wherein at least one RF front end RX circuit is dedicated to receiving one or more auxiliary signals.

34. The apparatus according to claim 28, wherein said signal combiner is operative to combine said digitized IF signals utilizing a multiplexing technique selected from the group consisting of frequency division multiplexing, code division multiple access (CDMA) and orthogonal frequency division multiple access (OFDMA).

35. A method of simultaneous full-duplex signal reception and transmission, said method comprising the steps of:
 sharing a single local oscillator between a receiver and a polar transmitter during full-duplex operation;
 phase modulating said local oscillator to generate a modulated TX signal thereby; and
 removing said phase modulation from said modulated TX signal for use as a local oscillator signal by said receiver.

36. The method according to claim 35, wherein said step of removing said phase modulation comprises the step of providing two dimensional transversal of rotating capacitors in a multi-tap direct sampling mixer in said receiver.

37. The method according to claim 35, wherein said step of removing said phase modulation comprises the step of applying clock edge synthesis.

38. The method according to claim 35, wherein said step of sharing said local oscillator comprises the step of performing frequency translation from a transmit local oscillator signal to a receive local oscillator signal utilizing an edge synthesizer.

39. A full-duplex transceiver, comprising:
 a local oscillator operative to be shared between a receiver and a polar transmitter during full-duplex operation;
 said transmitter comprising means for phase modulating said local oscillator;
 said receiver comprising means for removing phase modulation from said phase modulated local oscillator;
 a transmit processing path coupled to said transmitter and operative to generate a transmit signal in accordance with a signal input thereto; and
 a receive processing path coupled to said receiver and operative to generate a data output signal thereby.

40. The transceiver according to claim 39, wherein said receiver comprises a multi-tap direct sampling mixer incorporating two-dimensional transverse rotating capacitors therein.

41. The transceiver according to claim 39, wherein said step of removing said phase modulation comprises the step of applying clock edge synthesis.

42. The transceiver according to claim 39, wherein said step of sharing said local oscillator comprises the step of performing frequency translation from a transmit local oscillator signal to a receive local oscillator signal utilizing an edge synthesizer.

43. A full-duplex transceiver, comprising:
 a local oscillator operative to be shared between a receiver and a polar transmitter during full duplex operation;
 said receiver coupled to said local oscillator operative to generate a first local oscillator clock signal; and
 an edge synthesizer operative to receive said first local oscillator clock signal and to synthesize a second local oscillator clock signal therefrom.

44. The transceiver according to claim 43, said transmitter comprising means for phase modulating said second local oscillator clock signal.

\* \* \* \* \*